United States Patent
Kapusta et al.

(10) Patent No.: US 10,804,115 B2
(45) Date of Patent: Oct. 13, 2020

(54) ELECTRONICS PACKAGE WITH INTEGRATED INTERCONNECT STRUCTURE AND METHOD OF MANUFACTURING THEREOF

(71) Applicant: General Electric Company, Schenectady, NY (US)

(72) Inventors: Christopher James Kapusta, Delanson, NY (US); Raymond Albert Fillion, Niskayuna, NY (US); Risto Ilkka Sakari Tuominen, Tokyo (JP); Kaustubh Ravindra Nagarkar, Clifton Park, NY (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 15/668,502

(22) Filed: Aug. 3, 2017

(65) Prior Publication Data
US 2019/0043734 A1    Feb. 7, 2019

(51) Int. Cl.
*H01L 21/48*    (2006.01)
*H01L 21/56*    (2006.01)
(Continued)

(52) U.S. Cl.
CPC .......... *H01L 21/485* (2013.01); *H01L 21/486* (2013.01); *H01L 21/4853* (2013.01);
(Continued)

(58) Field of Classification Search
CPC . H01L 21/485; H01L 21/4857; H01L 23/3114
(Continued)

(56) References Cited

U.S. PATENT DOCUMENTS 6,306,680 B1  10/2001  Fillion et al.
6,433,412 B2   8/2002  Ando et al.
(Continued)

FOREIGN PATENT DOCUMENTS

JP   2004-281541 A   10/2004
KR  2015-0042362 A    4/2015

OTHER PUBLICATIONS

Ozmat et al., "A New Power Module Packaging Technology for Enhanced Thermal Performance," The Seventh Intersociety Conference on Thermal and Thermomechanical Phenomena in Electronic Systems, May 23-26, 2000, pp. 287-296.
(Continued)

*Primary Examiner* — Sheikh Maruf
(74) *Attorney, Agent, or Firm* — Ziolkowski Patent Solutions Group, SC

(57) ABSTRACT

An electronics package includes an insulating substrate, an electrical component having an active surface coupled to a first surface of the insulating substrate, and an insulating structure disposed adjacent the electrical component on the first surface of the insulating substrate. A first wiring layer is formed on a top surface of the insulating structure and extends down at least one sloped side surface of the insulating structure. A second wiring layer is formed on a second surface of the insulating substrate. The second wiring layer extends through a plurality of vias in the insulating substrate to electrically couple at least one contact pad on the active surface of the electrical component to the first wiring layer.

24 Claims, 19 Drawing Sheets

(51) Int. Cl.
*H01L 21/52* (2006.01)
*H01L 23/31* (2006.01)
*H01L 23/28* (2006.01)
*H01L 23/16* (2006.01)
*H01L 23/00* (2006.01)
H01L 23/538 (2006.01)
H01L 23/50 (2006.01)

(52) U.S. Cl.
CPC ...... *H01L 21/4857* (2013.01); *H01L 21/4889* (2013.01); *H01L 21/52* (2013.01); *H01L 21/56* (2013.01); *H01L 23/16* (2013.01); *H01L 23/28* (2013.01); *H01L 23/3107* (2013.01); *H01L 23/3114* (2013.01); *H01L 23/3135* (2013.01); *H01L 24/19* (2013.01); *H01L 24/20* (2013.01); *H01L 24/83* (2013.01); H01L 23/50 (2013.01); H01L 23/5389 (2013.01); H01L 2224/04105 (2013.01); H01L 2224/24195 (2013.01); H01L 2224/2919 (2013.01); H01L 2224/32225 (2013.01); H01L 2224/83092 (2013.01); H01L 2224/83191 (2013.01); H01L 2224/83192 (2013.01); H01L 2224/83862 (2013.01); H01L 2224/83865 (2013.01); H01L 2224/83874 (2013.01); H01L 2224/92144 (2013.01); H01L 2224/97 (2013.01); H01L 2924/1033 (2013.01); H01L 2924/10253 (2013.01); H01L 2924/10272 (2013.01); H01L 2924/10329 (2013.01); H01L 2924/13055 (2013.01); H01L 2924/13091 (2013.01); H01L 2924/1431 (2013.01); H01L 2924/1433 (2013.01); H01L 2924/1434 (2013.01); H01L 2924/1461 (2013.01); H01L 2924/19041 (2013.01); H01L 2924/19042 (2013.01); H01L 2924/19043 (2013.01); H01L 2924/19105 (2013.01)

(58) Field of Classification Search
USPC ........................................................ 257/774
See application file for complete search history.

(56) References Cited

U.S. PATENT DOCUMENTS

| | | | |
|---|---|---|---|
| 6,774,499 B1 | 8/2004 | Yang | |
| 7,752,751 B2 | 7/2010 | Kapusta et al. | |
| 7,777,351 B1 | 8/2010 | Berry et al. | |
| 7,902,660 B1 | 3/2011 | Lee et al. | |
| 8,115,117 B2 | 2/2012 | Kapusta et al. | |
| 8,276,268 B2 | 10/2012 | Kapusta et al. | |
| 9,337,163 B2 | 5/2016 | Delgado et al. | |
| 9,391,027 B2 | 7/2016 | Chauhan et al. | |
| 9,520,385 B1 | 12/2016 | Chen et al. | |
| 9,953,931 B1* | 4/2018 | Yao | H01L 23/4824 |
| 10,134,685 B1* | 11/2018 | Chen | H01L 21/4857 |
| 2002/0017721 A1 | 2/2002 | Huang et al. | |
| 2002/0090162 A1 | 7/2002 | Asada et al. | |
| 2003/0146503 A1 | 8/2003 | Khan et al. | |
| 2004/0155322 A1 | 8/2004 | Cho et al. | |
| 2004/0178508 A1 | 9/2004 | Nishimura et al. | |
| 2004/0238857 A1 | 12/2004 | Beroz et al. | |
| 2005/0006745 A1 | 1/2005 | Nishimura et al. | |
| 2005/0090050 A1 | 4/2005 | Shim et al. | |
| 2005/0098885 A1 | 5/2005 | Koyagi et al. | |
| 2005/0189636 A1 | 9/2005 | Savastiouk et al. | |
| 2006/0125077 A1 | 6/2006 | Akaike et al. | |
| 2006/0151206 A1 | 7/2006 | Maruyama et al. | |
| 2007/0069391 A1 | 3/2007 | Gritti et al. | |
| 2007/0096311 A1 | 5/2007 | Humpston et al. | |
| 2008/0087996 A1 | 4/2008 | Miyaki et al. | |
| 2008/0179503 A1 | 7/2008 | Camargo et al. | |
| 2008/0272470 A1 | 11/2008 | Do et al. | |
| 2008/0315371 A1 | 12/2008 | Tang et al. | |
| 2009/0008765 A1 | 1/2009 | Yamano et al. | |
| 2009/0057898 A1 | 3/2009 | Takaike et al. | |
| 2009/0075428 A1 | 3/2009 | Tang et al. | |
| 2009/0190009 A1* | 7/2009 | Kawasaki | H01L 27/14618 348/249 |
| 2009/0291296 A1 | 11/2009 | McConnelee et al. | |
| 2009/0309231 A1 | 12/2009 | Machida et al. | |
| 2009/0315057 A1* | 12/2009 | Konishi | H01L 24/97 257/98 |
| 2010/0019338 A1* | 1/2010 | Kwon | H01L 21/561 257/433 |
| 2010/0148335 A1 | 6/2010 | Mikami et al. | |
| 2010/0224992 A1 | 9/2010 | McConnelee et al. | |
| 2010/0230800 A1 | 9/2010 | Beaupre et al. | |
| 2010/0237477 A1 | 9/2010 | Pagaila et al. | |
| 2010/0295178 A1* | 11/2010 | Ishihara | H01L 21/6835 257/737 |
| 2011/0012269 A1* | 1/2011 | Ishihara | H01L 21/568 257/774 |
| 2011/0024888 A1 | 2/2011 | Pagaila et al. | |
| 2011/0024899 A1* | 2/2011 | Masumoto | H01L 23/49816 257/737 |
| 2011/0031598 A1 | 2/2011 | Lee et al. | |
| 2011/0057311 A1 | 3/2011 | Yutani et al. | |
| 2011/0080713 A1 | 4/2011 | Sunohara | |
| 2011/0084386 A1 | 4/2011 | Pendse | |
| 2011/0095441 A1 | 4/2011 | Fjelstad et al. | |
| 2011/0266665 A1 | 11/2011 | Gowda et al. | |
| 2011/0304015 A1* | 12/2011 | Kim | H01L 23/552 257/532 |
| 2011/0316140 A1 | 12/2011 | Nalla et al. | |
| 2012/0005887 A1 | 1/2012 | Mortensen et al. | |
| 2012/0009738 A1 | 1/2012 | Crawford et al. | |
| 2012/0049339 A1 | 3/2012 | Wang | |
| 2012/0080786 A1 | 4/2012 | Furutani et al. | |
| 2012/0086109 A1 | 4/2012 | Kim et al. | |
| 2012/0112336 A1 | 5/2012 | Guzek et al. | |
| 2012/0126423 A1 | 5/2012 | Hatori et al. | |
| 2012/0139095 A1 | 6/2012 | Manusharow et al. | |
| 2012/0139116 A1 | 6/2012 | Manusharow et al. | |
| 2012/0319274 A1 | 12/2012 | Tanaka et al. | |
| 2012/0319284 A1* | 12/2012 | Ko | H01L 24/92 257/773 |
| 2013/0052776 A1 | 2/2013 | Nalla et al. | |
| 2013/0134559 A1 | 5/2013 | Lin et al. | |
| 2013/0154108 A1 | 6/2013 | Lin et al. | |
| 2013/0256865 A1* | 10/2013 | Umeki | H01L 23/28 257/690 |
| 2014/0008785 A1 | 1/2014 | Lin et al. | |
| 2014/0029210 A1 | 1/2014 | Gowda et al. | |
| 2014/0029234 A1 | 1/2014 | Chauhan et al. | |
| 2014/0048951 A1 | 2/2014 | Lin et al. | |
| 2014/0077364 A1* | 3/2014 | Marimuthu | H01L 24/13 257/737 |
| 2014/0103527 A1* | 4/2014 | Marimuthu | H01L 21/6835 257/737 |
| 2014/0133104 A1 | 5/2014 | Delgado et al. | |
| 2014/0138807 A1 | 5/2014 | Gowda et al. | |
| 2014/0239477 A1 | 8/2014 | Kim et al. | |
| 2014/0252646 A1* | 9/2014 | Hung | H01L 23/481 257/774 |
| 2014/0264800 A1 | 9/2014 | Gowda et al. | |
| 2014/0312503 A1* | 10/2014 | Seo | H01L 27/14636 257/774 |
| 2014/0319679 A1 | 10/2014 | Lin et al. | |
| 2014/0332937 A1 | 11/2014 | Brunnbauer et al. | |
| 2015/0001708 A1* | 1/2015 | Lin | H01L 23/49811 257/737 |
| 2015/0014844 A1 | 1/2015 | Wu et al. | |
| 2015/0069612 A1 | 3/2015 | Chauhan et al. | |
| 2015/0084207 A1 | 3/2015 | Chauhan et al. | |
| 2015/0102502 A1* | 4/2015 | Chiu | H01L 21/561 257/774 |
| 2015/0187607 A1 | 7/2015 | Huang et al. | |
| 2015/0194375 A1 | 7/2015 | Gowda et al. | |
| 2015/0255418 A1 | 9/2015 | Gowda et al. | |
| 2015/0255432 A1* | 9/2015 | Lin | H01L 21/565 257/774 |

(56) References Cited

U.S. PATENT DOCUMENTS

| | | | |
|---|---|---|---|
| 2015/0262909 A1* | 9/2015 | Chen | H01L 21/76804 257/774 |
| 2016/0093525 A1* | 3/2016 | Cook | H01L 21/4867 257/676 |
| 2016/0093597 A1 | 3/2016 | Chang et al. | |
| 2016/0104666 A1 | 4/2016 | Gowda et al. | |
| 2016/0163566 A1* | 6/2016 | Chen | H01L 25/105 257/774 |
| 2016/0218049 A1* | 7/2016 | Lin | H01L 24/97 |
| 2016/0276311 A1* | 9/2016 | Meyer | H01L 23/49 |
| 2016/0315055 A1 | 10/2016 | Vogt et al. | |
| 2016/0322337 A1* | 11/2016 | Liang | H01L 25/105 |
| 2016/0351509 A1* | 12/2016 | Dang | H01L 25/0655 |
| 2017/0047266 A1 | 2/2017 | Ihara et al. | |
| 2017/0092567 A1 | 3/2017 | Vincent et al. | |
| 2017/0117200 A1 | 4/2017 | Kim et al. | |
| 2017/0141045 A1* | 5/2017 | Kim | H01L 23/552 |
| 2017/0141053 A1* | 5/2017 | Chen | H01L 21/565 |
| 2017/0154854 A1* | 6/2017 | Xiao | H01L 21/4853 |
| 2017/0162523 A1 | 6/2017 | Hu | |
| 2017/0334714 A1* | 11/2017 | Gao | B81B 7/02 |
| 2018/0019209 A1* | 1/2018 | Chang | H01L 25/50 |
| 2018/0026010 A1* | 1/2018 | Huang | H01L 25/0657 257/659 |
| 2018/0082981 A1* | 3/2018 | Gowda | H01L 23/34 |
| 2018/0114745 A1* | 4/2018 | Oratti Kalandar | H01L 23/49568 |
| 2018/0190581 A1 | 7/2018 | Lin | |
| 2018/0294233 A1* | 10/2018 | Yoon | H01L 23/3114 |

OTHER PUBLICATIONS

Ozmat et al., "An Advanced Approach to Power Module Packaging," International Workshop on Integrated Power Packaging, Jul. 14-15, 2000, pp. 8-11.

Tentzeris et al., "3D-/Inkjet-Printed RF Packages and Modules for IoT Applications up to sub-THz frequencies," The 57th Electronic Components and Technology Conference, ECTC 2017, pp, 1-37.

Esfahani et al., "High Aspect Ratio Lithography for Litho-Defined Wire Bonding," 2014 Electronic Components & Technology Conference, pp. 1556-1561.

Tehrani et al., "Inkjet-Printed 3D Interconnects for Millimeter-Wave System-on-Package Solutions," 2016 IEEE, pp. 1-4.

Hedges et al., "3D Aerosol Jet Printing—Adding Electronics Functionality to RPRM," Optomec, DDMC 2012 Conference, Mar. 14-15, 2012, pp. 1-5.

Tuominen et al., "Component Embedding Platform for Thin Profile SiP, POP and Fan-Out WLP," 2015 17th Electronics Packaging Technology Conference, Dec. 2-4, 2015, pp. 1-6.

Fisher et al., "High Frequency, Low Cost, Power Packaging Using Thin Film Power Overlay Technology," Tenth Annual Applied Power Electronics Conference and Exposition, APEC '95, Mar. 5-9, 1995, pp. 12-17.

Fukui et al., "MEMS Manufacturing Solutions," 26th Annual Advanced Semiconductor Manufacturing Conference (ASMC), May 3-6, 2015, pp. 356-361.

Gdula et al., "An Overlay Interconnect Technology for 1GHz. And Above MCMs," IEEE Proceedings Multi-Chip Module Conference, MCMC '92, Mar. 18-20, 1992, pp. 171-174.

International Search Report and Written Opinion issued in connection with corresponding PCT Application No. PCT/US18/43060 dated Nov. 6, 2018.

International Search Report and Written Opinion issued in connection with corresponding PCT Application No. PCT/US18/43003 dated Nov. 7, 2018.

* cited by examiner

ELECTRONICS PACKAGE WITH INTEGRATED INTERCONNECT STRUCTURE AND METHOD OF MANUFACTURING THEREOF

BACKGROUND OF THE INVENTION

Embodiments of the invention relate generally to semiconductor device packages or electronics packages and, more particularly, to an electronics package that includes an integrated interconnect structure formed from an insulating material that is metalized to include one or more electrical traces, which extend through the body of the electronics package to electrically connect contact pads on the die to contact terminals on the opposing side of the electronics package.

State of the art electronics packaging covers a wide range of methods, structures, and approaches from wire bond modules to flip chip modules and to embedded chip modules. Wire bonded modules are a mature packaging approach that is low cost but has limited electrical performance. These modules use wires bonded to chip pads to connect the top I/O pads of power devices to an interconnect structure such as a metal-insulator-metal substrate such as ceramic, Aluminum Nitride (AlN), or Silicon Carbide (SiC) substrate with patterned metal on top and bottom. Wire bonds have inherently high inductance, generally high series resistance, current crowding on the bond pads, and microcracking within the semiconductor devices near bonding sites. An exemplary construction of a prior art wire bond electronics package 10 is illustrated in FIG. 1 with two power semiconductor devices 12 mounted onto a leadframe 14 using component attach material 16. Portions of the leadframe 14 extend beyond the molding resin 26 forming terminals 18. Wire bonds 20 connect die pads 22 located on the active surface 24 of semiconductor devices 12 to selected areas on the leadframe 14. Molding resin 26 encapsulates semiconductor devices 12, wire bonds 20, and exposed portions of leadframe 14. PowerRibbon© Bonding (K&S) is a modified version of power module wire bonding that replaces Al wire bonds with Al ribbons that use thermos-compression to bond to the chip pads. Beneficially, PowerRibbon© Bonding has lower resistance and therefore is targeted for higher current modules. However, PowerRibbon© Bonding has high inductance and can cause substrate microcracking.

Prior art flip chip modules experience reduced semiconductor substrate damage as compared to wire bond packages through the use of solder bumps, which have larger current carrying cross-sections than wire bonds. A general construction of a prior art flip chip electronic package 28 is illustrated in FIG. 2 with two semiconductor devices 12 attached to a top side metal layer 30 of substrate 32 by means of flip chip solder bumps 34. Thermal cooling is achieved with thermal connections 36 formed on the back side 38 of semiconductor devices 12. Molding resin 26 encapsulates the semiconductor devices 12, with portions of the top side metal layer 30 extending beyond the molding resin 26 forming terminals 18. While flip chip modules such as that illustrated in FIG. 2 provide some advantages over wire bond technology, the flip chip solder bumps have poor electrical conductivity, are susceptible to solder fatigue, and provide a very poor thermal cooling pathway.

Prior art embedded device modules, such as the embedded device module 40 illustrated in FIG. 3 fabricated using General Electric Company's power overlay (POL) technology, address the limitations of wire bond and flip chip packages by eliminating wire bonds and solder bumps and replacing them with direct metallization contacts. In the embedded device module 40, semiconductor devices 12 are mounted onto a dielectric film 42. A post connector 44 is also attached to the dielectric film 42 to provide a top-to-bottom electrical connection for the module 40. Microvias 46 are formed through the dielectric film 42 to the input/output (I/O) contact pads 22 of semiconductor devices 12 and to the post connector 44. A metallization layer 48 is applied to the outer surface of the dielectric film 42, the microvias 46 and the exposed pads 22 to form an electrical connection to the semiconductor devices 12. The dielectric film 42 with attached semiconductor devices 12 and post connector 44 is bonded to a power substrate 32 using an electrically conductive component attach material 50 such as solder. The gaps between semiconductor devices 12 and post connector 44 are filled with a molding resin 26. The embedded device module 40 has reduced parasitics (e.g., resistance, capacitance, and inductance) and a superior thermal performance as compared to wire bond modules or flip chip modules.

Despite the advantages of an embedded device module construction, POL technology is more complex, less mature, and higher cost than wire bond and flip chip approaches. Electrical connections within the module 40 are typically formed by either forming through holes in the module 40 module using laser drilling and hole metallization or by forming a via to an inserted I/O structure or frame adjacent to the device that provide vertical connections. These approaches increase the complexity and cost of the module and can increase the module footprint.

Accordingly, it would be desirable to provide a new electronics packaging technology that permits construction of a highly miniaturized electronics package, allows for high pitch or high pin count applications, and provides one or more electrical connections between the bottom surface of the electronics package to the top of the semiconductor device or to an upper layer of the electronics package. Further, it would be desirable to have a packaging approach that has the performance and reliability advantages of embedded chip modules and the lower costs of wire bond or flip chip modules.

BRIEF DESCRIPTION OF THE INVENTION

In accordance with one aspect of the invention, an electronics package includes an insulating substrate, an electrical component having an active surface coupled to a first surface of the insulating substrate, and an insulating structure disposed adjacent the electrical component on the first surface of the insulating substrate. A first wiring layer is formed on a top surface of the insulating structure and extends down at least one sloped side surface of the insulating structure. A second wiring layer is formed on a second surface of the insulating substrate. The second wiring layer extends through a plurality of vias in the insulating substrate to electrically couple at least one contact pad on the active surface of the electrical component to the first wiring layer.

In accordance with another aspect of the invention, a method of manufacturing an electrical component includes coupling an electrical component to a first surface of an insulating substrate, disposing an insulating structure on the first surface of the insulating substrate, and forming a first wiring layer on a top surface and at least one sloped side surface of the insulating structure. The method also includes forming a second wiring layer on a second surface of the insulating substrate, the second wiring layer electrically coupling at least one contact pad of the electrical component to the first wiring layer through a plurality of vias in the insulating substrate.

In accordance with another aspect of the invention, an electrical package includes an electrical component coupled to a first surface of an insulating substrate and an insulating structure encapsulating at least a portion of a back surface and at least one side wall defining a perimeter of the electrical component. The insulating structure has at least one sloped side surface abutting the perimeter of the electrical component. A first wiring layer is formed on the at least one sloped side surface of the insulating substrate and extends over a top surface of the electrical component. A second wiring layer is formed on a second surface of the insulating substrate and extends through vias formed therein to electrically couple at least one contact pad on an active surface of the electrical component to the first wiring layer.

These and other advantages and features will be more readily understood from the following detailed description of preferred embodiments of the invention that is provided in connection with the accompanying drawings.

BRIEF DESCRIPTION OF THE DRAWINGS

The drawings illustrate embodiments presently contemplated for carrying out the invention.

In the drawings.

DETAILED DESCRIPTION

Figure 1:
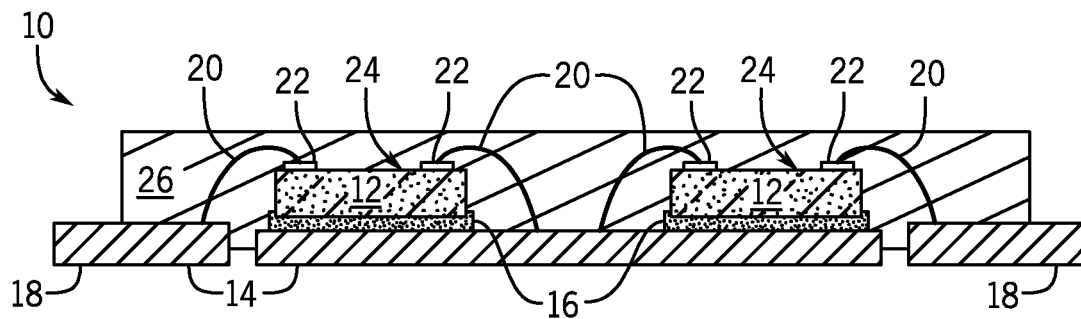
FIG. 1 is a schematic cross-sectional view of an exemplary prior art wire bond electronics package.
Figure 2:
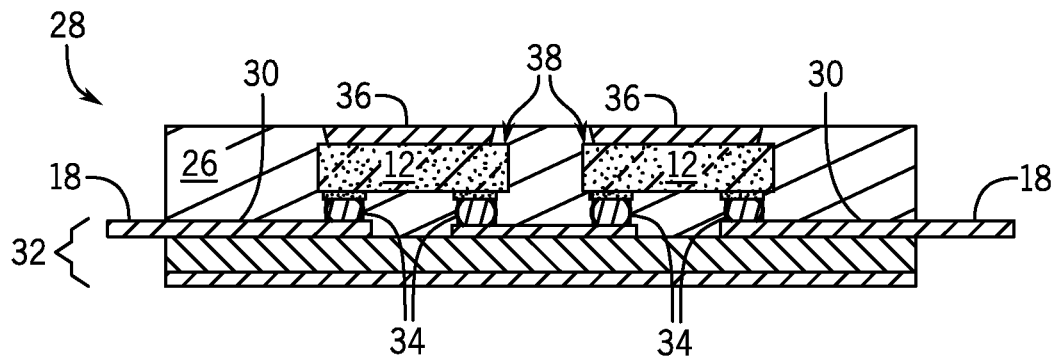
FIG. 2 is a schematic cross-sectional view of an exemplary prior art flip chip electronics package.
Figure 3:
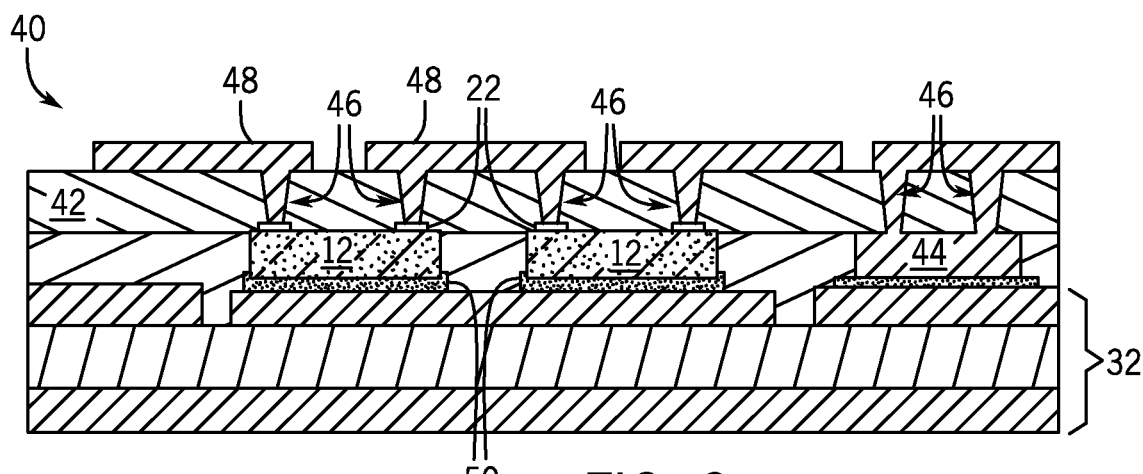
FIG. 3 is a schematic cross-sectional view of an exemplary prior art embedded chip electronics package.

Embodiments of the present invention provide for an electronics package or module in which the electrical interconnect(s) between the contact pads of the electrical component are routed from one side of the electronics package, through the body of the electronics package, and to the other side of the electronics package along one or more sloped side walls of a localized insulating structure or encapsulation material, thereby eliminating the need for conventional through hole structures. Complex routing can be patterned on the outer surface of this localized insulating structure to provide electrical interconnects between the I/O pads of the electrical component and back side connections of the electronics package. Embodiments of the invention therefore provide for an electronics package that includes high electrical conductivity connections from the semiconductor device to the terminals of the electronics package with a direct thermal path having low thermal conductivity. In some embodiments described herein, the semiconductor device is embedded within the insulating structure and thereby provides a low cost environmental protection for high reliability. The resulting electronics package can be surface mounted onto a substrate or placed within a multi-component module for complex circuits.

As used herein, the term "semiconductor device" refers to a semiconductor component, device, die or chip that perform specific functions such as a power transistor, power diode, analog amplifier, RF element, as non-limiting examples. Typical semiconductor devices include input/output (I/O) interconnections, referred to herein as contacts or contact pads, which are used to connect the semiconductor device to external circuitry and are electrically coupled to internal elements within the semiconductor device. The semiconductor devices described herein may be power semiconductor devices used as electrically controllable switches or rectifiers in power electronic circuits, such as switched mode power supplies, for example. Non-limiting examples of power semiconductor devices include insulated gate bipolar transistors (IGBTs), metal oxide semiconductor field effect transistors (MOSFETs), bipolar junction transistors (BJTs), integrated gate-commutated thyristors (IGCTs), gate turn-off (GTO) thyristors, Silicon Controlled Rectifiers (SCRs), diodes or other devices or combinations of devices including materials such as Silicon (Si), Silicon Carbide (SiC), Gallium Nitride (GaN), and Gallium Arsenide (GaAs). Semiconductor devices may also be digital logic devices, such as a microprocessor, microcontroller, memory device, video processor, or an Application Specific Integrated Circuit (ASIC), as non-limiting examples.

While the various embodiments of an electronics package referenced below are shown and described as including a particular arrangement of a semiconductor device, interconnection wiring and electronic package terminals, it is understood that alternative arrangements and configurations could also be implemented and thus embodiments of the invention are not limited only to the specifically illustrated devices and arrangements thereof. That is, the electronics package embodiments described below should also be understood to encompass electronic packages that might include additional electronic components and/or one or more alternative device types of semiconductor devices including acoustic devices, microwave devices, millimeterwave devices, RF communication devices, and micro-electro-mechanical (MEMS) devices. The electronics packages described herein may also include one or more resistors, capacitors, inductors, filters and similar devices and combinations thereof. As used herein the terms "electrical component" and "electronic component" may be understand to encompass any of the various types of semiconductor devices described above in addition to resistors, capacitors, inductors, filters and similar passive devices, and energy storage components.

Figure 10:
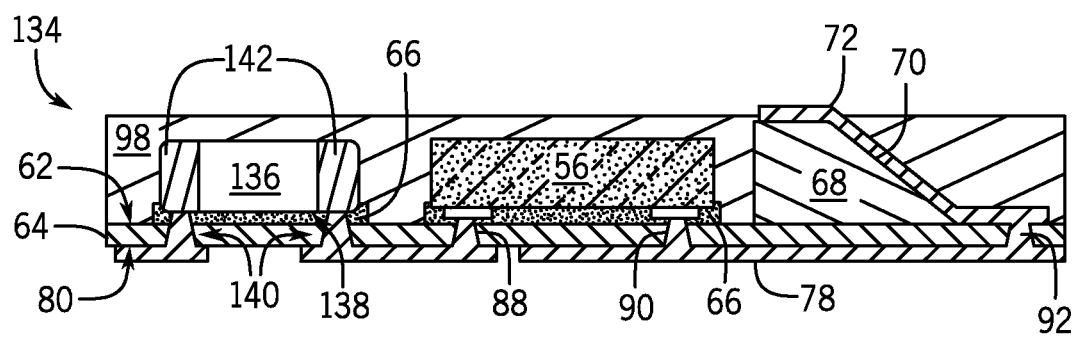
FIG. 10 is a schematic cross-sectional view of an electronics package with an integrated interconnect structure positioned adjacent an electrical component, according to yet another embodiment of the invention.

FIGS. 4-7 illustrate electronics packages 52, 54 according to alternative embodiments of the invention. Packages 52, 54 include an electrical component such as a semiconductor device 56 as well as a number of similar components that are referenced with common part numbers as appropriate. While each package 52, 54 are shown with only a single embedded semiconductor device 56, it is contemplated that alternative embodiments may include multiple semiconductor devices as well as one or more passive devices such as, for example, capacitors, resistors, and/or inductors in a similar manner as depicted in FIG. 10.

Figure 4:
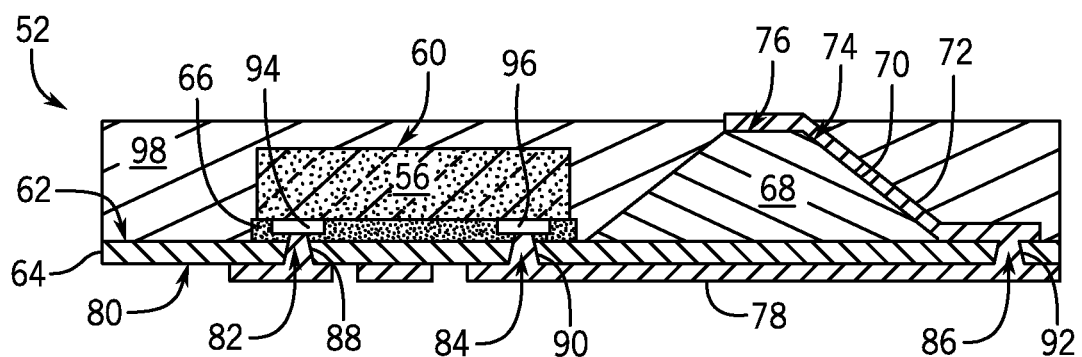
FIG. 4 is a schematic cross-sectional view of an electronics package with an integrated interconnect structure positioned adjacent an electrical component, according to an embodiment of the invention.

Referring first to FIG. 4, electronics package 52 includes a semiconductor device 56 having an active surface 58 and a back surface 60 or back side surface. Active surface 58 is coupled to a first surface 62 of an insulating substrate 64 using a component attach material 66. According to various embodiments, insulating substrate 64 may be provided in the form of an insulating film or dielectric substrate, such as for example a Kapton® laminate flex, although other suitable electrically insulating materials may also be employed, such as Ultem®, polytetrafluoroethylene (PTFE), or another polymer film, such as a liquid crystal polymer (LCP) or a polyimide substrate, as non-limiting examples. Component attach material 66 is an electrically insulating material that adheres to surrounding components of the electronics package 52 such as a polymeric material (e.g., epoxy, silicone, liquid crystal polymer, or a ceramic, silica, or metal filled polymer) or other organic material as non-limiting examples. In some embodiments, component attach material 66 is provided on insulating substrate 64 in either an uncured or partial cured (i.e., B-stage) form. Alternatively, component attach material 66 may be applied to semiconductor device 56 prior to placement on insulating substrate 64. In alternative embodiments, semiconductor device 56 may be affixed to insulating substrate 64 by way of an adhesive property of the insulating substrate 64 itself. In such an embodiment, component attach material 66 is omitted and insulating substrate 64 is provided in the form of a single dielectric layer having adhesive properties. Non-limiting examples of such an adhesive dielectric layer include a spin-on dielectric such as polyimide or polybenzoxzaole (PBO).

An insulating structure 68 with at least one sloped side surface or sloped side wall 70 is coupled to the first surface 62 of insulating substrate 64. According to alternative embodiments, insulating structure 68 may be a cured photo-patternable resin, a polymer such as, for example, an epoxy material, a pre-preg material, a ceramic material, a composite dielectric material, or any other electrically insulating organic or inorganic material. A first wiring layer 72 or metallization layer is disposed on the outer surface 74 of insulating structure 68. As shown, first wiring layer 72 is positioned on a top surface 76 of insulating structure 68, extends down the sloped side wall 70, and covers a portion of the first surface 62 of insulating substrate 64.

A second wiring layer 78 or metallization layer is disposed on a second surface 80 of insulating substrate 64 and into vias 82, 84, 86 formed through insulating substrate 64. Penetrating contacts 88, 90, 92 are formed, which electrically couple the second wiring layer 78 to contact pads 94, 96 located on the active surface 58 of semiconductor device 56 and to first wiring layer 72. Contact pads 94, 96 provide conductive routes (I/O connections) to internal contacts within semiconductor device 56. Contact pads 94, 96 may have a composition that includes a variety of electrically conductive materials such as aluminum, copper, gold, silver, nickel, or combinations thereof as non-limiting examples. While illustrated as structures that protrude outward from the active surface 24 of semiconductor device 56, contact pads 94, 96 may also be contact terminals located substantially flush or level with the active surface 24 of semiconductor device 56.

An electrically insulating material 98 overlays the semiconductor device 56, the insulating structure 68, first wiring layer 72, and exposed portions of the first surface 62 of the insulating substrate 64. Insulating material 98 may encapsulate all of semiconductor device 56 or portions thereof, in alternative embodiments.

Figure 5:
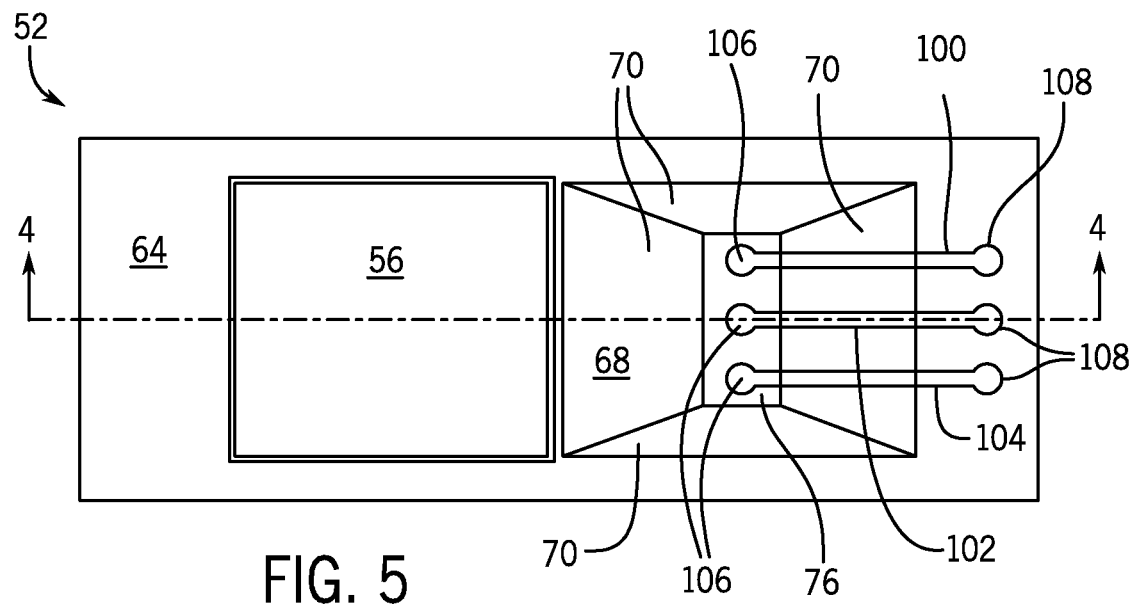
FIG. 5 is a topside view of the electronics package of FIG. 4, with the insulating material omitted.

A topside view of electronics package 52 is provided in FIG. 5, with the insulating material 98 omitted for purposes of clarity to illustrate an exemplary configuration of first wiring layer 72. As shown, first wiring layer 72 includes multiple electrical traces 100, 102, 104 that each include a top side terminal pad 106 located on the top surface 76 of insulating structure 68 and a bottom side terminal pad 108 on the first surface 62 of insulating substrate 64. Each of these traces 100, 102, 104 may be configured to create connections on the top side of the electronics package 52, through the body of the electronics package 52, and to respective contact pads 94, 96 of semiconductor device 56. As one example, trace 100 is electrically connected to contact pad 94 through penetrating contact 88, trace 102 is electrically connected to contact pad 96 through penetrating contact 90, and electrical trace 104 is electrically connected to another contact pad of semiconductor device 56 not visible in the cross-sectional view provided in FIG. 4. In the illustrated embodiment, traces 100, 102, 104 are located on a common sloped side wall 70 of insulating structure 68. In alternative embodiments, any of these traces 100-104 or additional traces may be formed on any of the other side walls 70 of insulating structure 68 and having alternative configurations based on the desired location of I/Os within the final electronics package. Further, the width and/or thickness of the electrical traces 100-104 may be varied from trace to trace within the electronics package 52 depending on the current carrying requirements and particular function of the associated contact pad 94, 96, with wider and/or thicker traces being formed to contact pads with higher current carrying requirements as appropriate.

Figure 6:
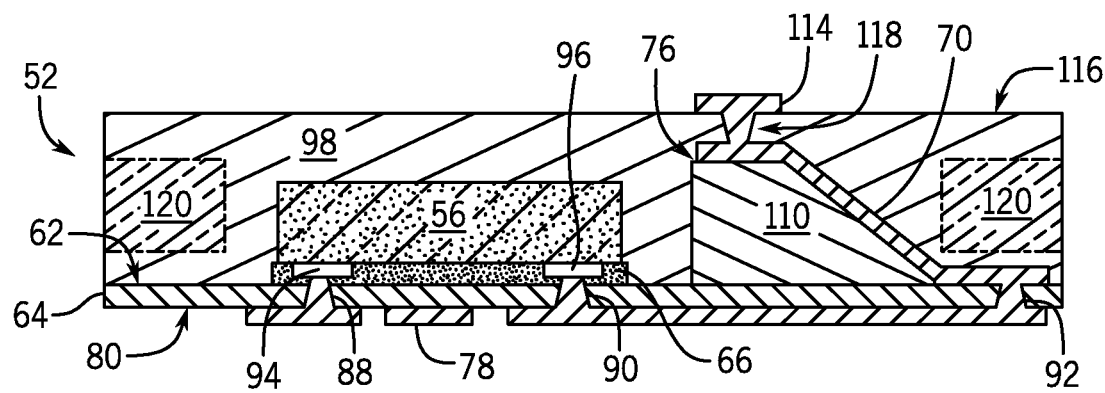
FIG. 6 is a schematic cross-sectional view of an electronics package with an integrated interconnect structure positioned adjacent an electrical component, according to another embodiment of the invention.

As shown in FIGS. 4 and 5, the insulating structure 68 of electronics package 52 has a generally pyramidal or trapezoidal shape with four sloped sidewalls 70. In an alternative embodiment shown in FIG. 6, electronics package 54 includes an insulating structure 110 with one sloped side wall 70. A topside view of electronics package 54 is provided in FIG. 7, with insulating material 98 again omitted to more clearly illustrate the configuration of electrical traces 100-104, which extend from a top surface 76 of insulating structure 110, down the sloped side wall 70, and to insulating substrate 64 in a similar manner as described with respect to electronics package 52. Traces 100-104 are electrically coupled with contact pads 94, 96 of semiconductor device 56 by way of penetrating contacts 88-92 and second wiring layer 78. Because the insulating material 98 of electronics package 54 encapsulates the top side terminal pads 106 of traces 100-104, a third wiring layer 114 is provided on the top surface 116 of insulating material 98. This third wiring layer 114 is electrically coupled to top side terminal pads 106 through metalized microvias 118 formed through insulating material 98, as shown in FIG. 6.

Figure 7:
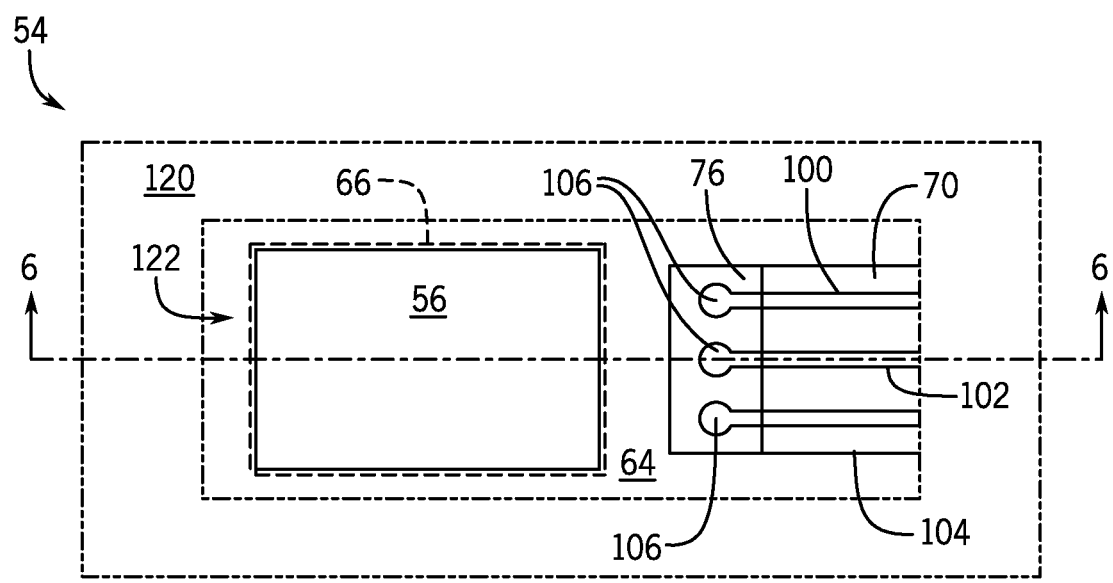
FIG. 7 is a topside view of the electronics package of FIG. 6, with the insulating material omitted.

Electronics package 54 also includes an optional support structure or a core structure 120 (shown in phantom) that provides additional dimensional stability to electronics package 54. Core structure 120 may be a printed circuit board (PCB) core material, such as, for example, an epoxy material with a fiberglass mat, a pre-preg material, polyimide film/layer, a ceramic material, glass, aluminum, a composite dielectric material, or other similar/suitable organic material or inorganic material that provides mechanical robustness to electronics package 54. As shown in FIG. 7, core structure 120 includes an opening 122 that surrounds semiconductor device 56 and insulating structure 110. Opening 122 may be formed for example by mechanical punch, laser cutting, water jet or mechanical milling. Insulating material 98 fills the gaps between core structure 120 and insulating substrate 64 and covers first wiring layer 72. It is contemplated that core structure 120 and/or a third wiring layer 114 may be incorporated into any of the other embodiments of an electronics package described herein in a similar manner. While not illustrated in FIG. 6, in embodiments where core structure 120 is a printed circuit board, it is contemplated that second wiring layer 78 and/or third wiring layer 114 may extend through additional microvias in insulating material 98 and in insulating substrate 64 to electrically couple with contact locations on the bottom and/or top surfaces core structure 120.

Figure 8:
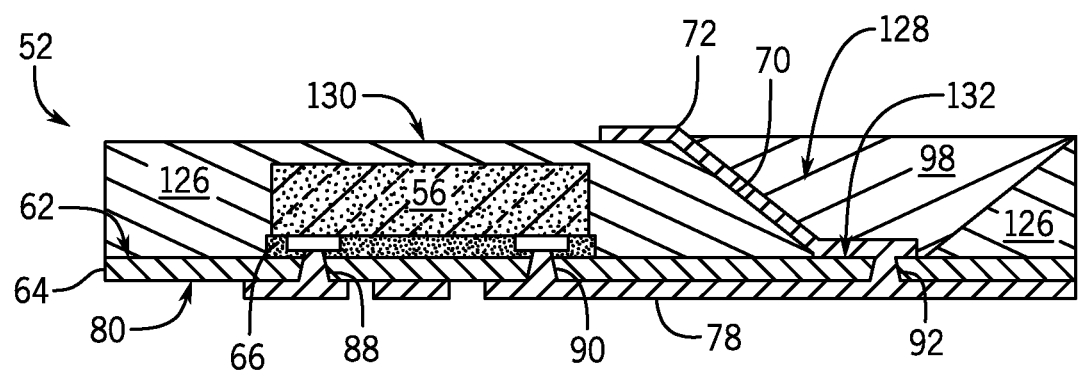
FIG. 8 is a schematic cross-sectional view of an electronics package with an integrated interconnect structure that embeds an electrical component, according to yet another embodiment of the invention.

Yet another embodiment of an electronics package 124 is illustrated in FIG. 8. Similar components to electronics package 124 and electronics packages 52, 54 are referred to with similar part numbering as appropriate. In this embodiment, an insulating structure 126 encapsulates at least a portion of, and in some embodiments all of, semiconductor device 56. A cavity 128 is formed in insulating structure 126, which includes at least one sloped side wall 70. First wiring layer 72 is disposed on a top surface 130 of insulating structure 126 and extends down the sloped side wall 70 and onto an exposed portion 132 of the first surface 62 of insulating substrate 64. An insulating material 98 fills the cavity 128 formed in insulating structure 126.

Figure 9:
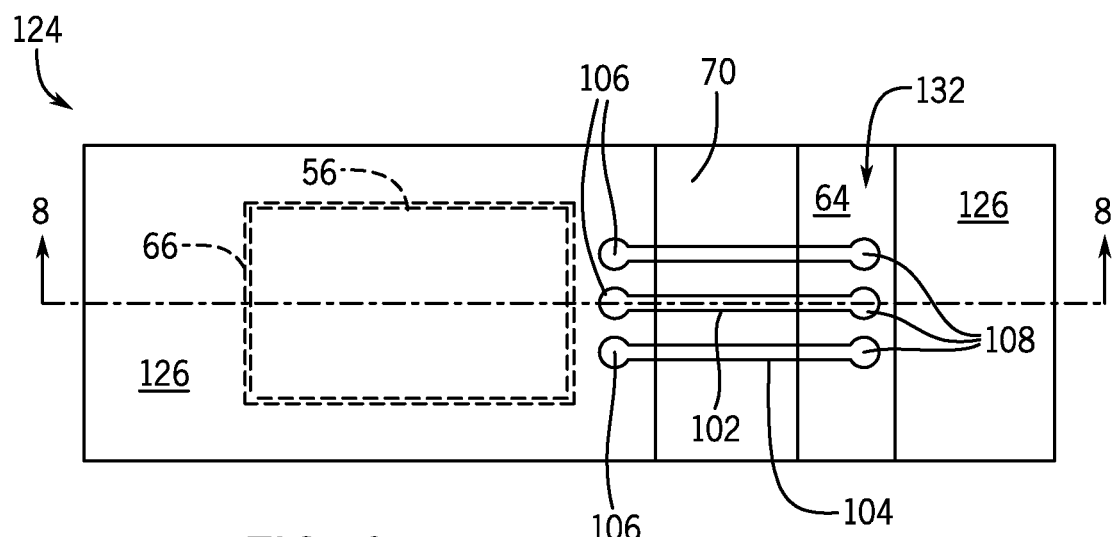
FIG. 9 is a topside view of the electronics package of FIG. 8, with the insulating material omitted.

A topside view of electronic package 124 is illustrated in FIG. 9, with insulating material 98 omitted for purposes of clarity. As shown, electrical traces 100-104 include bottom side terminal pads 108, which electrically couple to contact pads 94, 96 by way of penetrating contacts 88-92 and second wiring layer 78, and top side terminal pads 106, which form I/O connections on the top side of electronic package 124. In an alternate embodiment, insulating material 98 may form a layer covering the top surface 130 of insulating structure 126 and the top side terminal pads 106 of first wiring layer 72. In such an embodiment, microvias and a third wiring layer would be provided in a similar manner as shown in FIG. 6 to provide topside I/O connections.

Yet another embodiment of an electronics package 134 is depicted in FIG. 10. Again, components common to electronics package 134, electronics package 52 (FIG. 4), and electronics package 54 (FIG. 6) are referenced with common part numbering. Similar to packages 52, 54, electronics package 134 includes a semiconductor device 56 and an insulating structure 68 provided on a first surface 62 of insulating substrate 64. In the illustrated embodiment, insulating structure 68 has a single sloped side wall 70 similar to FIG. 6. In an alternative embodiment insulating structure 68 may be formed having two or more sloped side walls 70.

Figure 11:
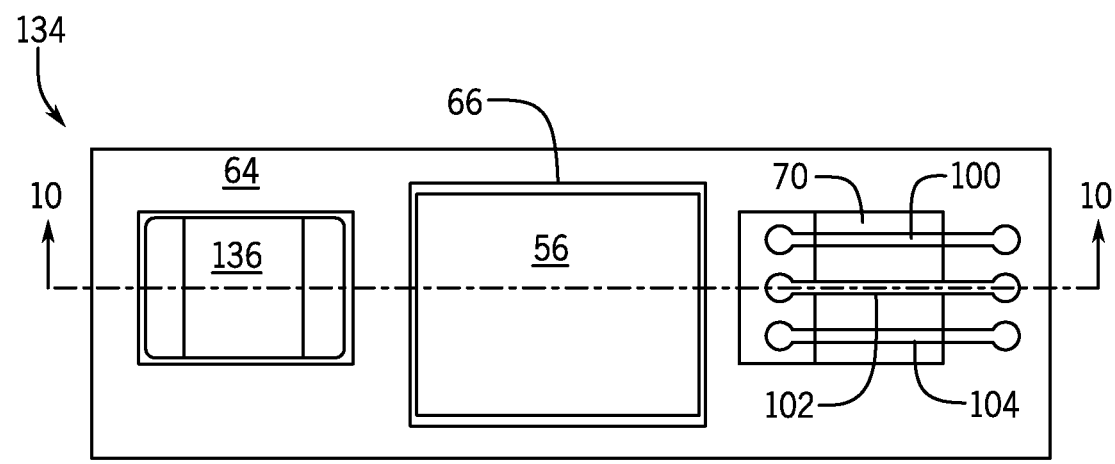
FIG. 11 is a topside view of the electronics package of FIG. 10, with the insulating material omitted.

Electronics package 134 also includes a passive component 136 having a mounting surface 138 coupled to first surface 62 of insulating structure 68. Portions of second wiring layer 78 extend through vias 140 in insulating substrate 64 to electrically couple with terminals 142 of passive component 136. Insulating material 98 overlays semiconductor device 56, passive component 136, exposed portions of insulating substrate 64, and all or portions of insulating structure 68. The insulating material 98 is omitted in the topside view of electronics package 134 provided in FIG. 11 to clearly illustrate the configuration of first wiring layer 72, which includes multiple electrical traces 100-104 similar to those described above. In an alternative embodiment, insulating structure 68 may be formed to embed either or both of semiconductor device 56 and passive component 136 in a similar manner as illustrated in FIG. 8.

Referring now to FIGS. 12-21, a technique for manufacturing the electronics package 52 of FIG. 4 is set forth, according to one embodiment of the invention, with each figure illustrating a cross-section of the electronics package 52 during the build-up process. One skilled in the art will recognize that minor modifications to the steps described herein may be made to manufacture electronics packages 54, 124, 134 or variations thereof. While FIGS. 12-21 illustrate the manufacture of a single electronics package, one skilled in the art will recognize that multiple electronics packages could be manufactured in a similar manner at the panel level and then singulated into individual electronics packages as desired.

Figure 12:
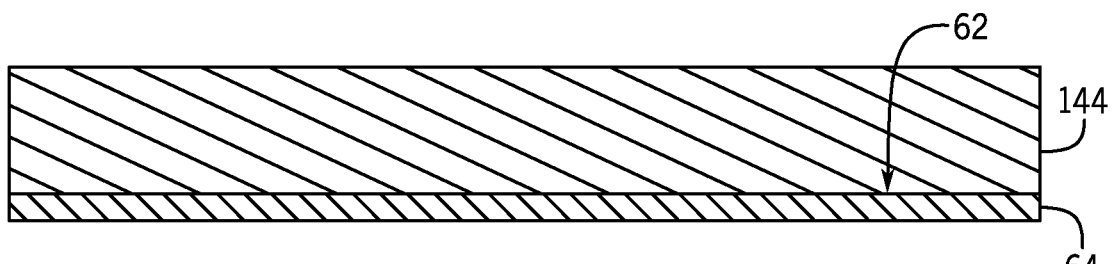
FIGS. 12-21 are schematic cross-sectional side views of the electronics package of FIG. 4 during various stages of a manufacturing/build-up process, according to an embodiment of the invention.
Figure 13:
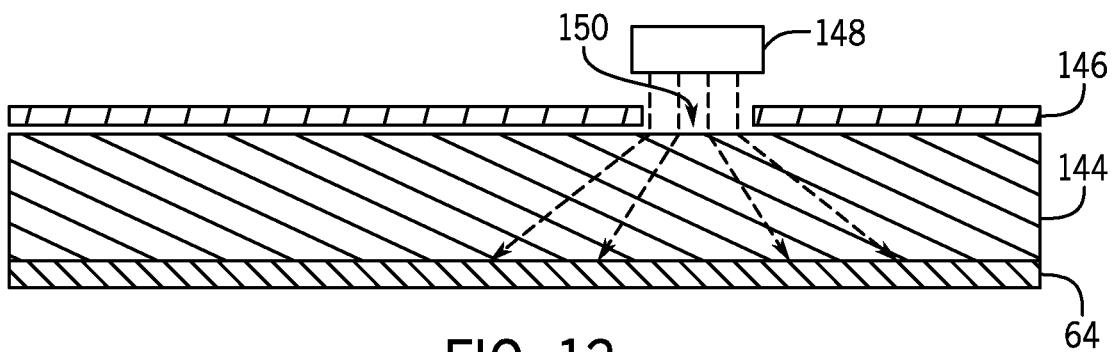
Figure 14:
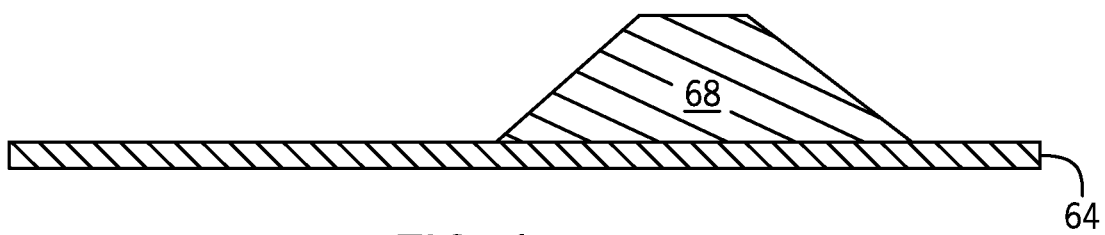

Referring first to FIG. 12, fabrication of electronics package 52 begins by depositing a layer of photo-patternable resin material 144 onto the first surface 62 of insulating substrate 64. According to various embodiments, deposition may be accomplished by a pour molding or spin coating technique. In one non-limiting embodiment, photo-patternable resin material 144 is applied to a thickness of 10 to 200 microns. However, it will be understood that the thickness of photo-patternable resin material 144 may be selected to be thicker or thinner than the stated range based on the design specifications of a particular application. Next, a photo-patterning mask 146, shown in FIG. 13, is placed over the surface of photo-patternable resin material 144 and a light source 148 radiates light onto photo-patterning mask 146. In one embodiment, light source 148 is a UV source and photo-patternable resin material 144 is a material that cures when exposed to UV light. A defocused beam of light from light source 148 passes through an opening 150 in the photo-patterning mask 146. The width of the beam of light expands as the light goes further from the photo-patterning mask 146 and selectively cures regions of the photo-patternable resin material 144. A solvent rinse is used to remove uncured photo-patternable resin material 144, yielding the pyramidal or trapezoidal insulating structure 68 illustrated in FIG. 14. Alternatively, insulating structure 68 may be formed using a grey scale mask.

In an alternative embodiment, insulating structure 68 may be formed by depositing a resin material onto select areas of first surface 62 of insulating substrate 64 using a direct write process such as, for example, ink jet printing or three-dimensional (3D) printing, wherein the resin material is build up on the select areas of first surface 62 until the desired thickness and geometry of insulating structure 68 is achieved. Thereafter, the resin material is cured using heat, UV light, microwaves, or the like.

Alternatively, insulating structure 68 may be fabricated prior to attachment to the insulating substrate 64. In such an embodiment, a single-site resin structure or a multi-site resin structure may be fabricated using any standard resin molding method such as, for example, compression molding, injection molding, or pour molding, or by cutting the desired geometry from a sheet of resin material. In cases where a multi-site resin structure is initially made, single-site insulating structures are diced or cut from the multi-site structure such as by laser, a blade, or a mechanical punch. The resulting individual, single-site insulating structure 68 is then mounted onto first surface 62 of insulating substrate 64 using an adhesive (not shown) or a self-adhesive property of the resin material of insulating structure 68, with a conventional pick and place machine being used to position the insulating structure 68 at its designated location. In such an embodiment, semiconductor device 56 may be mounted onto insulating substrate 64 either before or after mounting the pre-fabricated insulating structure 68.

Figure 15:
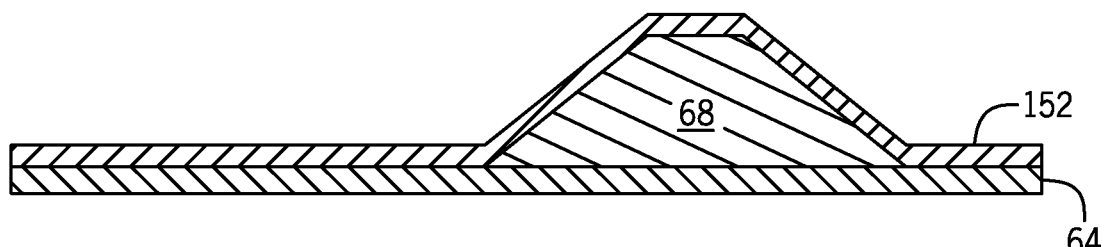
Figure 16:
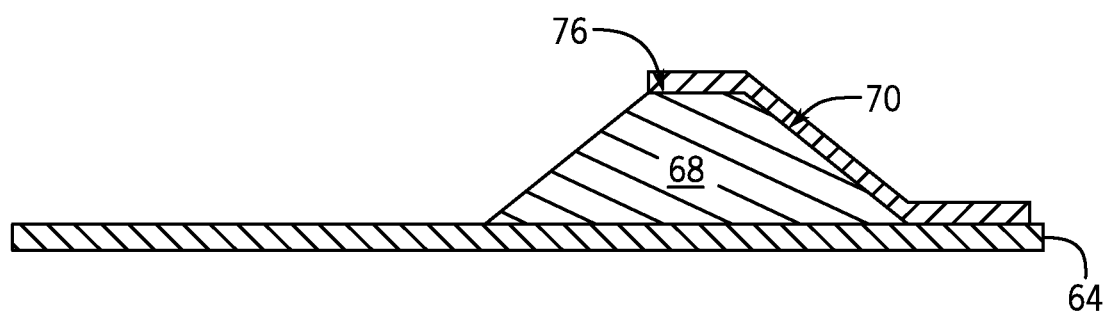

In a next step of the fabrication process, the first surface 62 of insulating substrate 64 and insulating structure 68 are covered with a first conductive layer 152, as shown in FIG. 15. In alternative embodiments, first conductive layer 152 is a metal such as, for example, copper, aluminum, or any other standard wiring metal. First conductive layer 152 may be deposited by one or more of a sputtering and electroplating technique, evaporation, electroless plating, or any other standard metal deposition process. First conductive layer 152 is patterned to form a first wiring layer 72 that includes wiring on the top surface 76 and at least one of the sloped side walls 70 of insulating structure 68, as shown in FIG. 16. Patterning may be accomplished using a semi-additive patterning technique where a titanium adhesion layer and a seed metal (not shown), such as copper, is applied to the surface of insulating structure 68 and exposed regions of the first surface 62 of insulating substrate 64. A photo-resist (not shown) is applied to the seed metal, patterned, and a thick metal is patterned plated-up until first conductive layer 152 reaches a desired thickness. The photo-resist is removed and the exposed seed layer is removed by etching. In other embodiments, conductive printing techniques or alternative patterning techniques such as fully subtractive patterning or additive metallization may also be used to form first wiring layer 72. It is contemplated that first wiring layer 72 may be formed using any known method capable of forming high density routing patterns with the desired current carrying capabilities.

Figure 17:
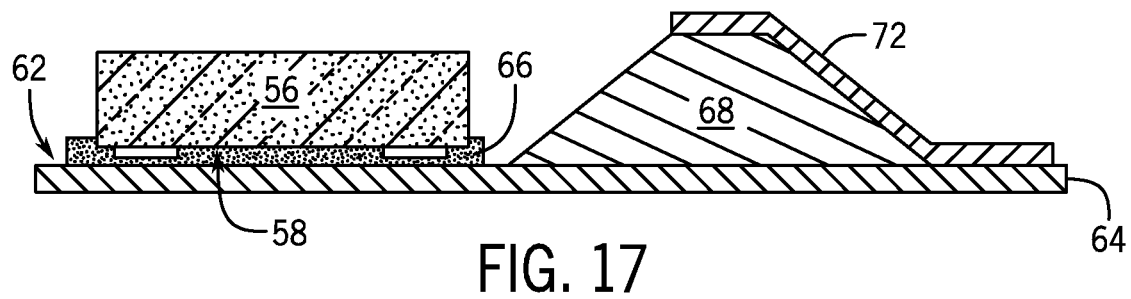

Referring to FIG. 17, component attach material 66 is applied to one or more die attach locations on first surface 62 of insulating substrate 64. In some embodiments, the component attach material 66 may be applied by stencil, screen printing, or using a direct dispense technique such as ink jetting, for example. Semiconductor device 56 is placed active surface 58 face down into the component attach material 66 using conventional pick and place equipment and methods. After being positioned, the semiconductor device 56 is bonded to insulating substrate 64 by fully curing component attach material 66 using heat, UV light, or microwave radiation, as examples. In one embodiment, a partial vacuum and/or above atmospheric pressure may be used to promote the removal of volatiles from the adhesive during cure if any are present. One skilled in the art will recognize that alternative techniques for applying component attach material 66 may be utilized—for example applying a component attach material to coat the entirety of exposed surfaces of insulating structure 68 or by applying a component attach material directly to the active surface 58 of semiconductor device 56 before placing the semiconductor device 56 onto insulating substrate 64.

Figure 18:
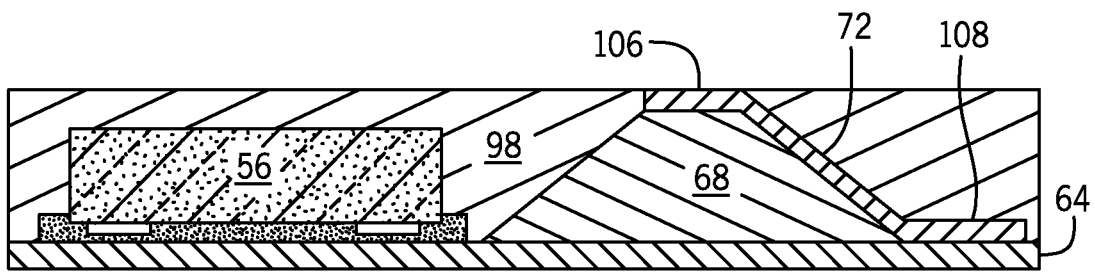
Figure 19:
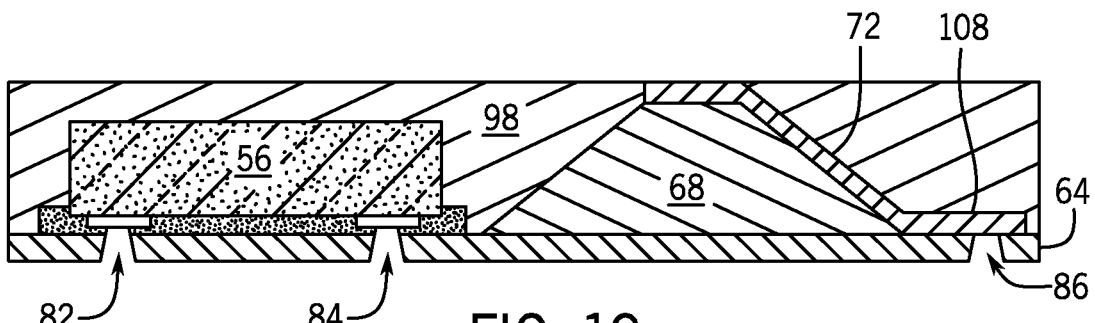
Figure 21:
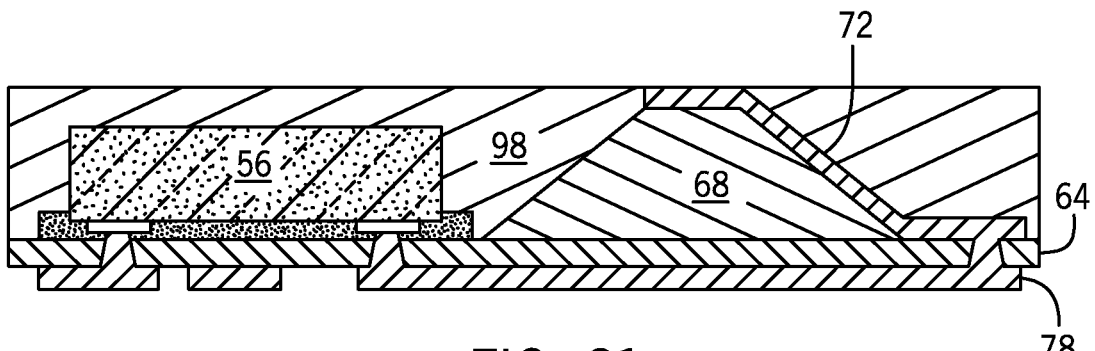

In a next step of the fabrication technique shown in FIG. 18, insulating material 98 is applied over semiconductor device 56 and insulating structure 68. The top side terminal pads 106 of first wiring layer 72 are exposed either after the insulating material 98 is applied (as shown in FIG. 18) or after forming second wiring layer 78 (FIG. 21). The bottom side terminal pads 108 of first wiring layer 72 are connected to semiconductor device 56 by first forming vias 82-86 through insulating substrate 64 at the location of contact pads 94, 96 and bottom side terminal pads 108, as shown in FIG. 19. Vias 82-86 may be formed by laser ablation, photo-definition, or mechanical drilling, plasma etch, chemical etch, or any other standard via formation process. In an alternative embodiment, insulating substrate 64 may be provided with predrilled vias 82-86. Furthermore, a combination of pre- and post-drilled vias could be employed. Vias 82-86 may be formed having angled side surfaces, as shown in FIG. 19, to facilitate later filling and metal deposition, or having straight side surfaces in an alternative embodiment.

Figure 20:
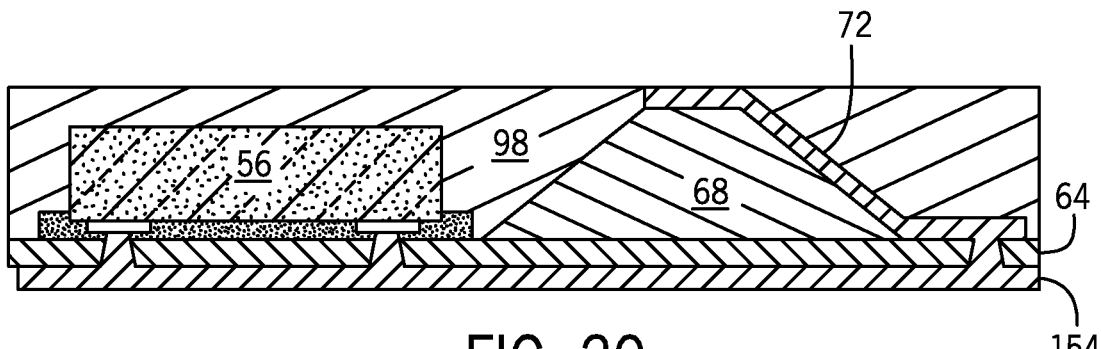

Upon securing semiconductor device 56 onto insulating substrate 64 and after forming vias 82-86, the vias 82-86 are cleaned such as through a reactive ion etching (ME) desoot process or laser process, as one example. Second conductive layer 154, shown in FIG. 20, is applied to the second surface 80 of insulating substrate 64 and into vias 82-86 to electrically connect die pads 94, 96 to electrical traces 100-104. Second conductive layer 154 may be formed in a manner similar to that described above for first conductive layer 152 and is patterned using any standard patterning technique to form second wiring layer 78, as shown in FIG. 21, with the second wiring layer 78 including multiple traces or conductive pathways on the second surface 80 of insulating substrate 64.

Figure 22:
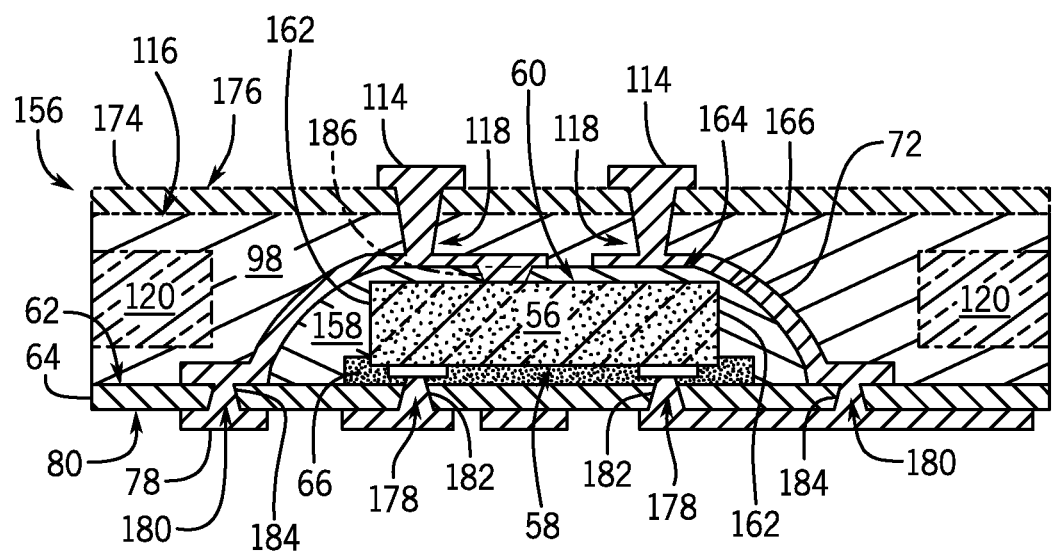
FIG. 22 is a schematic cross-sectional view of an electronics package with an integrated interconnect structure that embeds an electrical component, according to yet another embodiment of the invention.

Referring now to FIG. 22, an alternative embodiment of an electronics package 156 is illustrated. Similar to the previously described electronics package embodiments, electronics package 156 includes semiconductor device 56 having active surface 58 coupled to the first surface 62 of insulating substrate 64 with component attach material 66. Electronics package 156 also includes an insulating structure 158 that is formed of similar materials as insulating structure 68 of FIG. 4 but that differs from insulating structure 68 in that it surrounds the perimeter 160 of semiconductor device 56 and encapsulates the back surface 60 and the side walls 162 of semiconductor device 56. In an alternative embodiment, insulating structure 158 may be formed to surround only a portion of the perimeter 160 of semiconductor device 56, for example by surrounding less than all of the side walls 162 of the semiconductor device 56.

Figure 23:
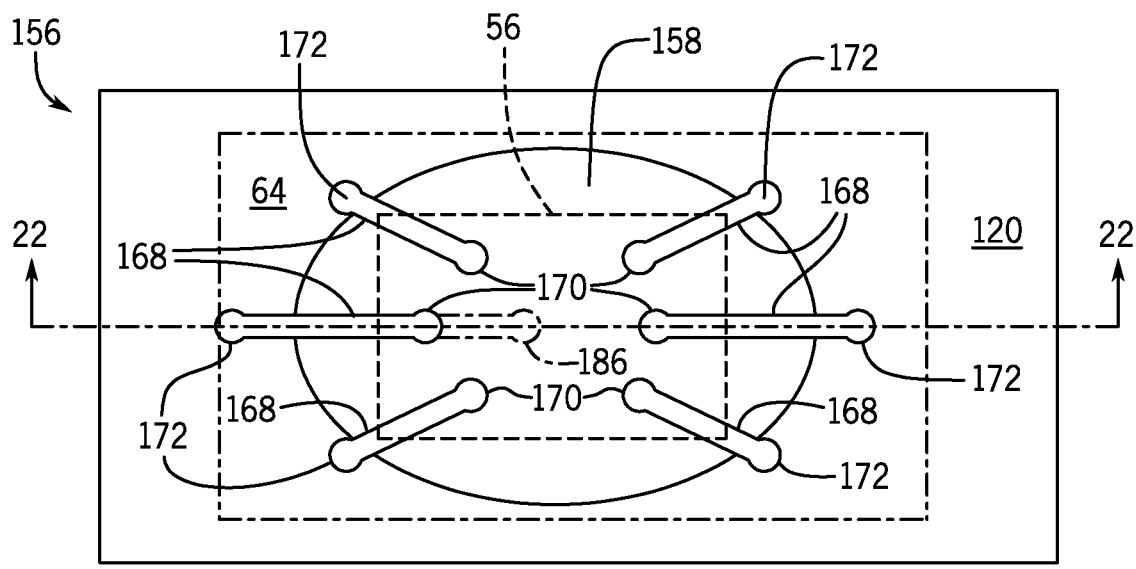
FIG. 23 is a topside view of the electronics package of FIG. 22, with the insulating material and third wiring layer omitted.

First wiring layer 72 is applied to the insulating structure 158 such that it covers a portion of the top surface 164 of insulating structure 158 and extends down at least one sloped side wall 166 of the structure 158 and onto the first surface 62 of insulating substrate 64. As shown in FIG. 23, first wiring layer 72 includes a pattern of electrical traces 168 each having a top side terminal pad 170 and a bottom side terminal pad 172, similar to traces 100-104 (FIG. 4).

Referring again to FIG. 22, insulating material 98 overlays the semiconductor device 56, insulating structure 158, exposed portions of insulating substrate 64, and first wiring layer 72. In one embodiment, an optional second insulating substrate 174 (shown in phantom) is applied to the top surface 116 of insulating material 98. Second insulating substrate 174 may be formed from any of the same materials as described for insulating substrate 64. Third wiring layer 114 is formed either on the top surface 176 of the second insulating substrate 174 (or directly on the top surface 116 of insulating material 98 when second insulating substrate 174 is omitted) and extends through microvias 118 therein to electrically couple with top side terminal pads 170 of electrical traces 168. Second wiring layer 78 is disposed on the second surface 80 of insulating substrate 64 and into vias 178, 180 formed therethrough to create penetrating contacts 182, 184 electrically coupled with contact pads 94, 96 of semiconductor device 56 and first wiring layer 72, respectively. Electrical traces 168 thereby form electrical connections between contact pads 94, 96 and the I/O connections created by third wiring layer 114 on the topside of electronics package 156. A second insulating substrate may be incorporated into any of the other electronics package embodiments described herein in a similar manner.

Electronics package 156 may also include one or more optional backside vias 186 (shown in phantom) formed through insulating material 98 to the back surface 60 of semiconductor device 56. In such an embodiment, first wiring layer 72 extends into backside via 186 to contact the back surface 60 of semiconductor device 56. Such a connection may be provided to ground semiconductor device 56, for example. In one embodiment, electronics package 156 also includes optional core structure 120 (shown in phantom), which includes an opening 122 surrounding semiconductor device 56 and insulating structure 158 and which provides dimensional stability to electronics package 156.

Figure 24:
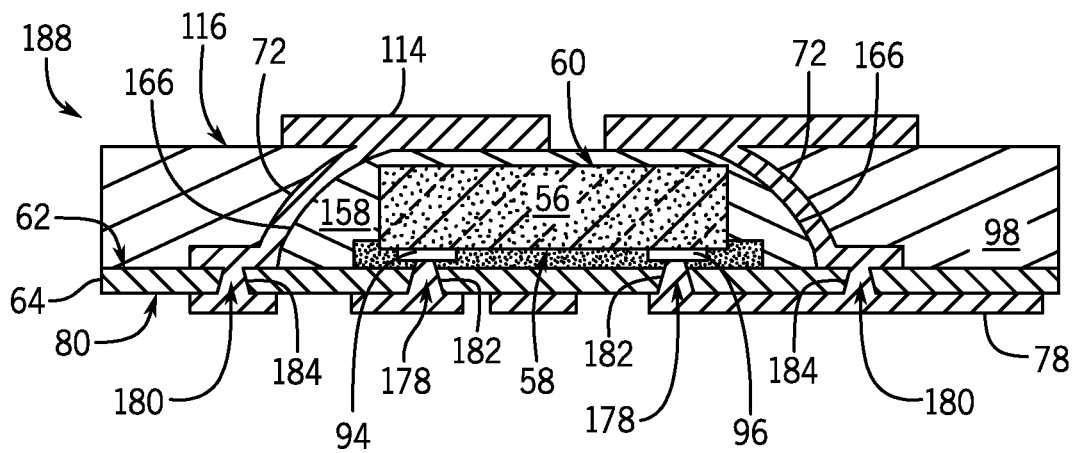
FIG. 24 is a schematic cross-sectional view of an electronics package with an integrated interconnect structure that embeds an electrical component, according to yet another embodiment of the invention.
Figure 25:
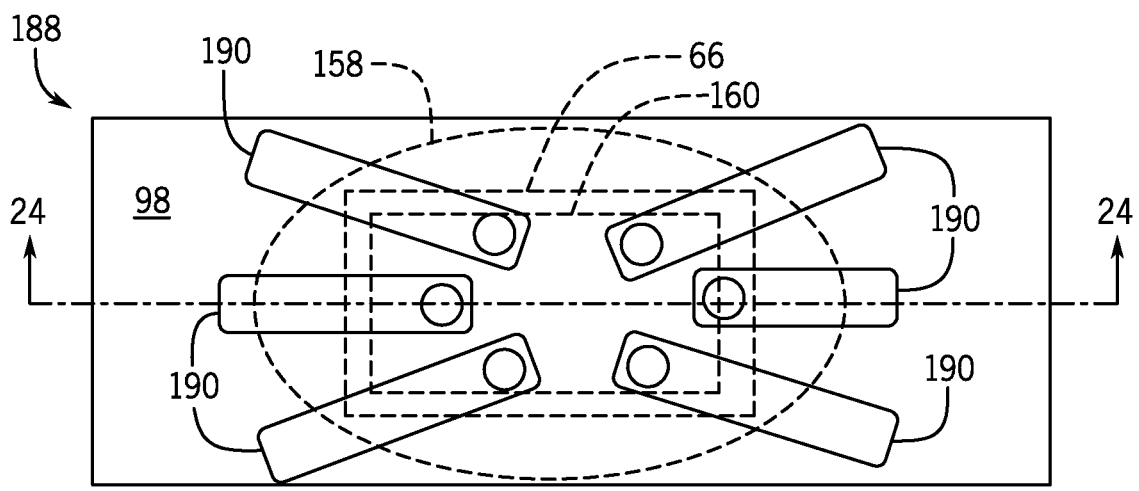
FIG. 25 is a topside view of the electronics package of FIG. 24.

Yet another embodiment of an electronic package 188 is illustrated in FIG. 24. Similar to electronics package 156 of FIG. 22, electronic package 188 includes an insulating structure 158 that surrounds the perimeter 160 and back surface 60 of semiconductor device 56. Insulating material 98 encapsulates the sloped side walls 166 of insulating structure 158 and the first wiring layer 72 that is formed on the sloped side walls 166. Second wiring layer 78 is disposed on the second surface 80 of insulating substrate 64 and extends into vias 178, 180 in insulating substrate 64 forming penetrating contacts 182, 184 that electrically connect to first wiring layer 72 and to contact pads 94, 96 on active surface 58 of semiconductor device 56. Third wiring layer 114 is formed on the top surface 116 of insulating material 98 and is patterned to form a number of top side terminal pads 190, an exemplary configuration of which is illustrated in the top view of electronics package 188 provided in FIG. 25.

Figure 26:
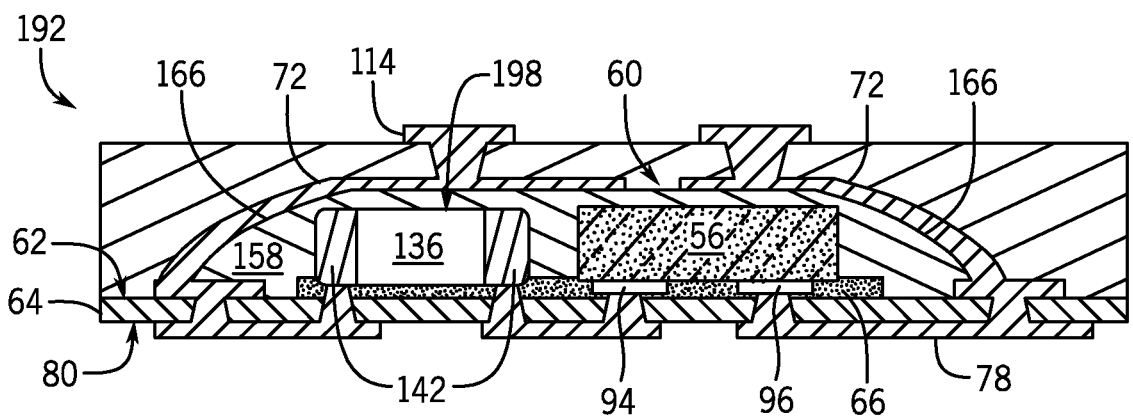
FIG. 26 is a schematic cross-sectional view of an electronics package with an integrated interconnect structure that embeds multiple electrical components, according to yet another embodiment of the invention.
Figure 27:
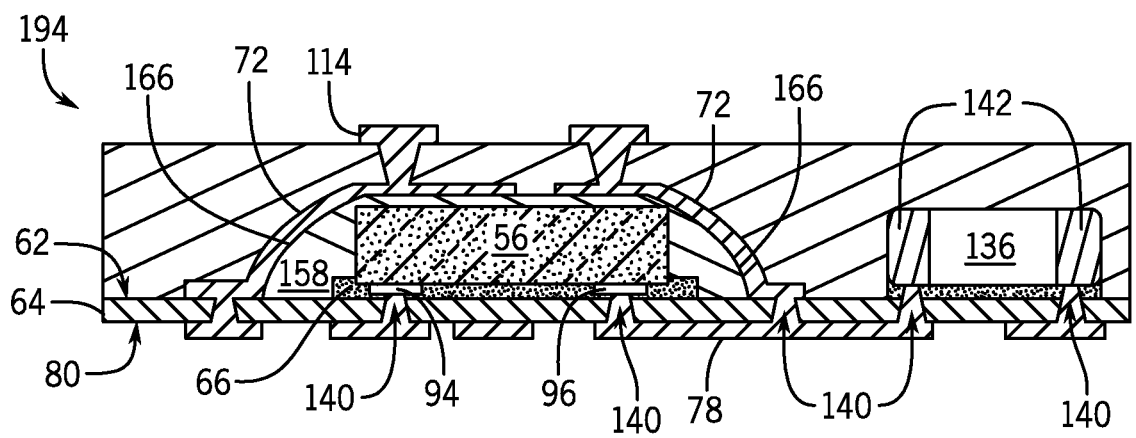
FIG. 27 is a schematic cross-sectional view of an electronics package with an integrated interconnect structure that embeds an electrical component, according to yet another embodiment of the invention.
Figure 28:
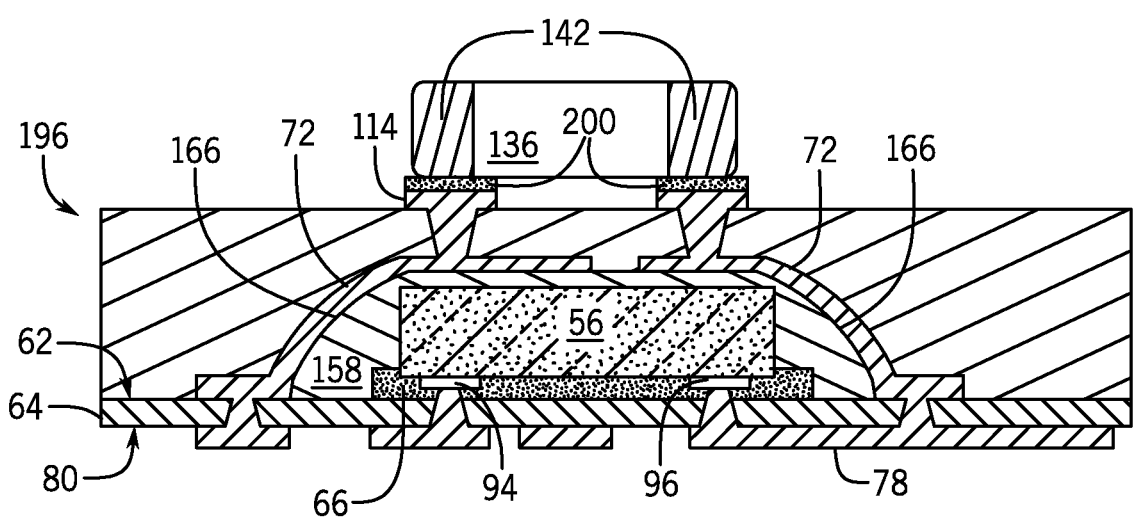
FIG. 28 is a schematic cross-sectional view of an electronics package with an integrated interconnect structure that embeds an electrical component, according to yet another embodiment of the invention.
Figure 29:
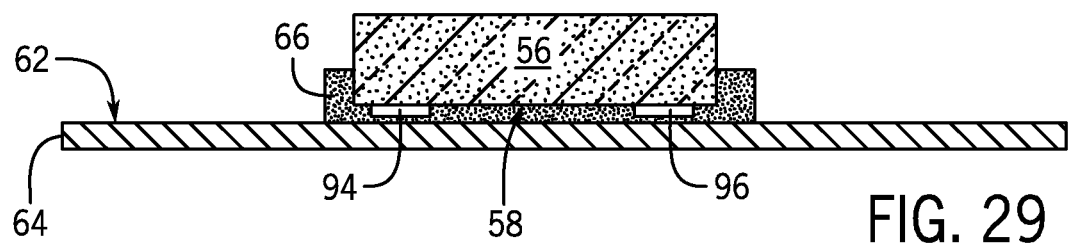
FIGS. 29-41 are schematic cross-sectional side views of the electronics package of FIG. 24 during various stages of a manufacturing/build-up process, according to an embodiment of the invention.
Figure 30:
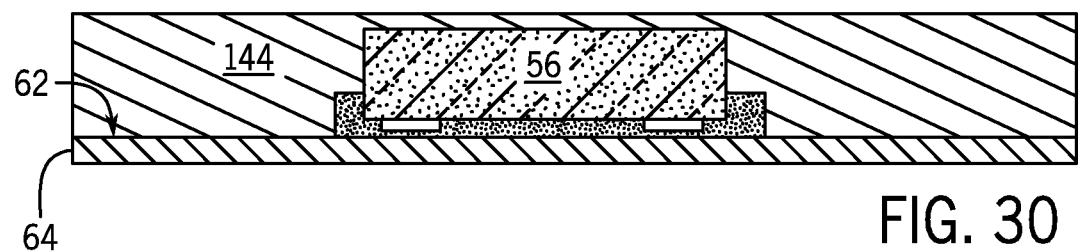

Referring now to FIGS. 26, 27, and 28, alternative embodiments of electronics packages 192, 194, 196 that include a passive component 136 in addition to semiconductor device 56 are illustrated. Components of electronics packages 192-196 similar to those previously described are referenced with common part numbering. Referring first to electronics package 192, passive component 136 is disposed on first surface 62 of insulating substrate 64 adjacent semiconductor device 56. Insulating structure 158 is formed as a common cap structure that surrounds passive component 136 and semiconductor device 56 and covers the respective top surfaces 198, 60 thereof. First wiring layer 72 extends down sloped side walls 166 of insulating structure 158 and is electrically coupled to terminals 142 of passive component 136 and to contact pads 94, 96 of semiconductor device 56 through second wiring layer 78.

In the embodiment of electronics package 194 shown in FIG. 27, passive component 136 is disposed on the first surface 62 of insulating substrate 64, but is located outside of the insulating structure 158. Terminals 142 of passive component 136 are coupled to one or more contact pads 94, 96 of semiconductor device 56 through vias 140 formed in insulating substrate 64 in a similar manner as described with respect to electronics package 134 of FIG. 10.

Referring now to FIG. 28, the electronics package 196 includes a passive component 136 that is coupled to the third wiring layer 114 by way of electrical connection elements 200. According to alternative embodiments, electrical connection elements 200 are an electrically conductive material such as, for example, solder or a conductive adhesive.

Figure 42:
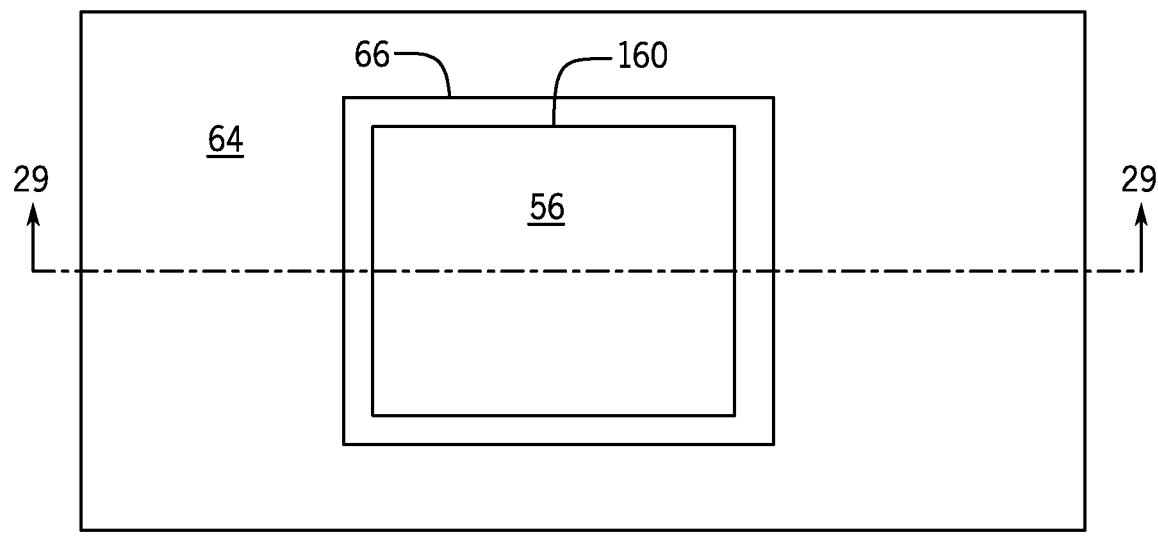
FIGS. 42, 43, and 44 are schematic top views of the electronics package of FIG. 24 during select stages of the manufacturing/build-up process illustrated in FIGS. 29-38.

FIGS. 29-35 are schematic cross-sectional views that illustrate the steps of an exemplary process for manufacturing the electronics package 188 of FIG. 24, according to one embodiment of the invention. Schematic top views of the electronics package 188 during select steps of the manufacturing process are provided in FIGS. 42, 43, and 44 and will be described in more detail below. In an initial step of the manufacturing process, component attach material 66 is applied to the first surface 62 of insulating substrate 64. Semiconductor device 56 is placed active surface 58 down into the component attach material 66 and bonded thereto by curing the component attach material 66 such as by heat or microwave radiation, as non-limiting examples. Component attach material 66 is applied to coat die attach locations, and in some embodiments extends outside the outer perimeter 160 of the semiconductor device 56, as shown in FIG. 42. In alternative embodiments, component attach material 66 may be applied to semiconductor device 56 prior to positioning semiconductor device 56 on insulating substrate 64 or omitted entirely in cases where insulating substrate 64 has adhesive properties.

Figure 31:
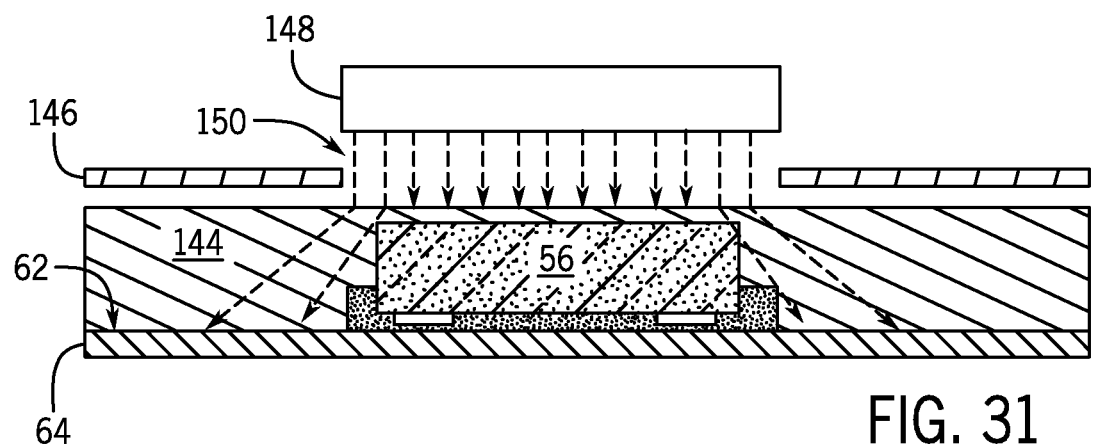

Next, a layer of photo-patternable resin material 144 (FIG. 30) is applied over the semiconductor device 56 and the first surface 62 of insulating substrate 64. In one non-limiting embodiment, photo-patternable resin material 144 is applied having a thickness in the range of 50 to 200 microns. However, it is contemplated that resin material 144 may be thicker or thinner in alternative embodiments. As shown in FIG. 31, photo-patterning mask 146 is placed over the surface of photo-patternable resin material 144. Light source 148 radiates light onto the photo-patterning mask 146 and defocused light passes through an opening 150 in the photo-patterning mask 146. The width of the beam of defocused light expands the farther it extends into the photo-patternable resin material 144 and selectively cures regions of the photo-patternable resin material 144.

Figure 32:
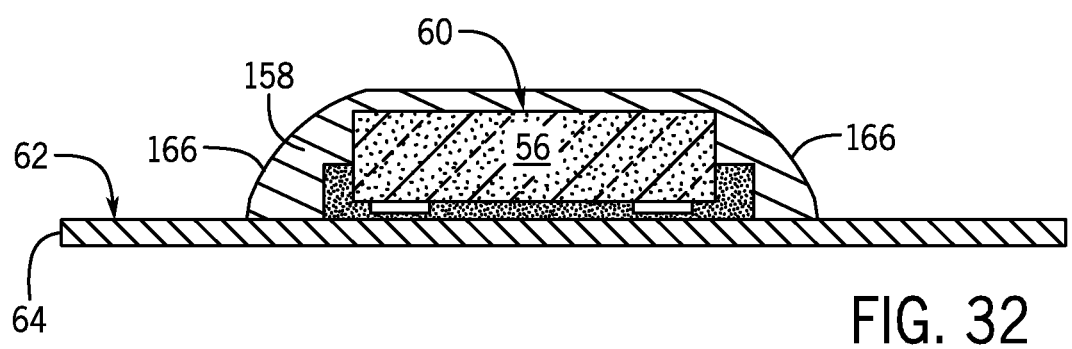
Figure 43:
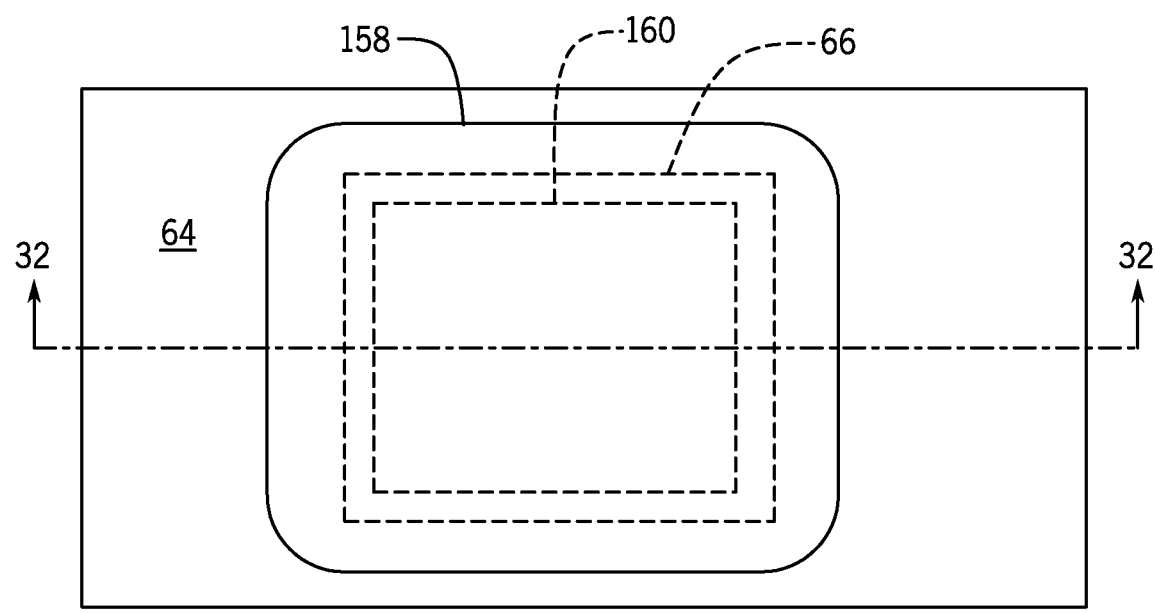
Figure 44:
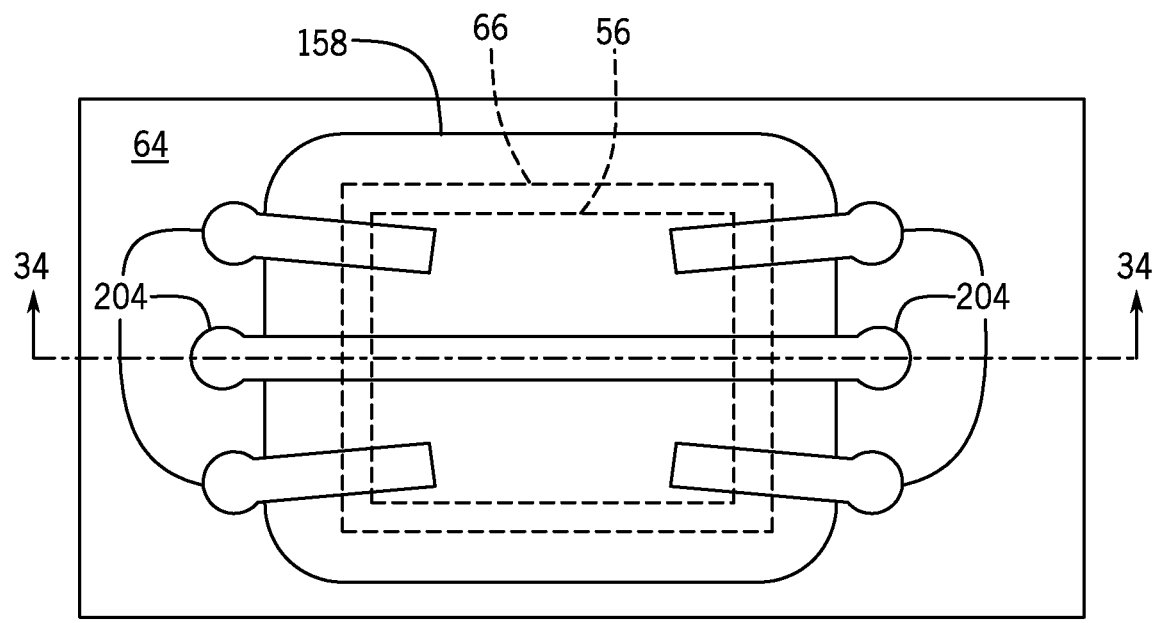

Next, a solvent rinse is used to remove uncured photo-patternable resin material 144, leaving the cured insulating structure 158 shown in FIG. 32. A topside view of the partially manufactured electronics package 188 is illustrated in FIG. 43. As shown in FIGS. 32 and 43, the insulating structure 158 covers the back surface 60 and surrounds the perimeter 160 of semiconductor device 56, thereby encapsulating the device 56.

In alternative embodiments of the invention, insulating structure 158 is formed by depositing a resin material onto the back surface 60 of the semiconductor device 56 and to selective areas of the insulating substrate 64 adjacent the semiconductor device 56 such that the resin material surrounds the perimeter 160, covers the back surface 60 of the semiconductor device 56, and creates the insulating structure 158 having sloping side walls 166. Deposition may be accomplished using a direct dispense tool such as an ink jet printer, a spray system, or a liquid dispense head, as non-limiting examples. Thereafter, the resin material is cured using heat, UV light, microwaves, or the like. In yet another embodiment, the insulating structure 18 may be formed by a direct write imaging system such as a laser or a 3D printing technique.

Figure 33:
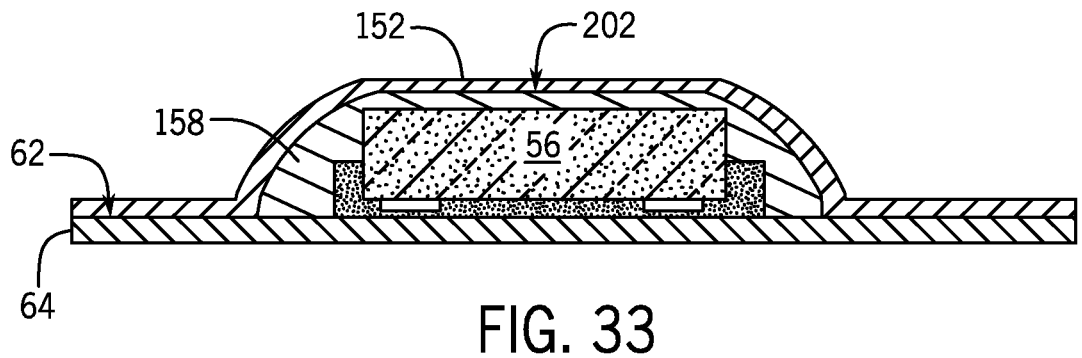
Figure 34:
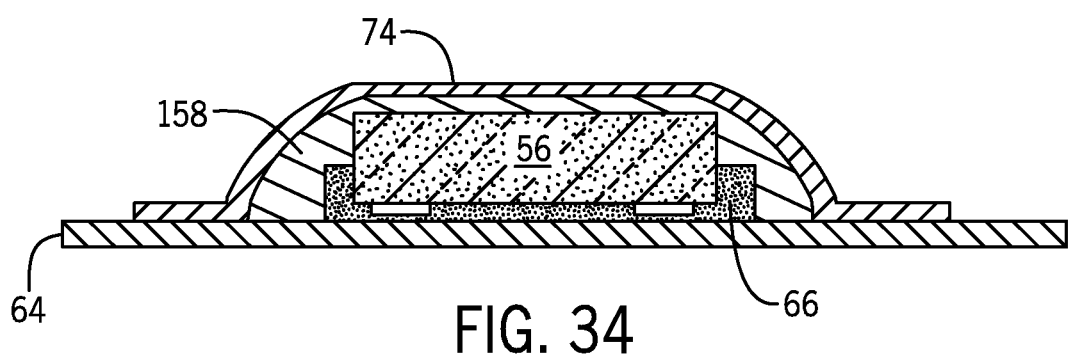

Referring now to FIG. 33, first conductive material layer 152 is applied on the outer surface 202 of insulating structure 158 and exposed regions of the first surface 62 of insulating substrate 64. According to alternative embodiments, the conductive material layer 152 is metal such as copper, aluminum, or other standard wiring metal and is deposited by one or more of sputtering, evaporation, electroless plating, electroplating, or other standard metal deposition processes. First conductive material layer 152 is then patterned to form the first wiring layer 72 (FIG. 34) having one or more electrical traces 204. An exemplary configuration of the traces 204 of first wiring layer 72 is shown in more detail in the top view provided in FIG. 44. However, one skilled in the art will recognize that the first wiring layer 72 may be formed in numerous alternative configurations based on the contact pad configuration of semiconductor device 56 and the desired location of I/Os within the final electronics package 188. In one embodiment, the patterning step may be carried out using a semi-additive patterning technique wherein a first seed metal or barrier metal (e.g., titanium) is applied to the outer surface 202 of insulating structure 158 and the exposed regions of first surface 62 of insulating substrate 64. A photo-resist (not shown) is applied to the seed metal and patterned, a layer of bulk metal (e.g., copper) is plated up atop the seed or barrier metal. The barrier layer can have a thickness of 0.01 to 1 micron and the bulk metal can have a thickness of 1 to 20 microns according to an exemplary, non-limiting embodiment. The photo-resist is removed and the exposed seed layer is removed by etching. The remaining seed metal and the plated up layer of metal form the first wiring layer 72 illustrated in FIG. 34. In alternative embodiments first wiring layer 72 may be formed using other known patterning techniques such as, for example, fully subtractive patterning, semi-additive pattern plate-up, or additive plate-up. In yet other embodiments, first wiring layer 72 is a printed conductive material formed using a deposition technique such as inkjet printing, screen printing, or dispensing, as non-limiting examples.

Figure 35:
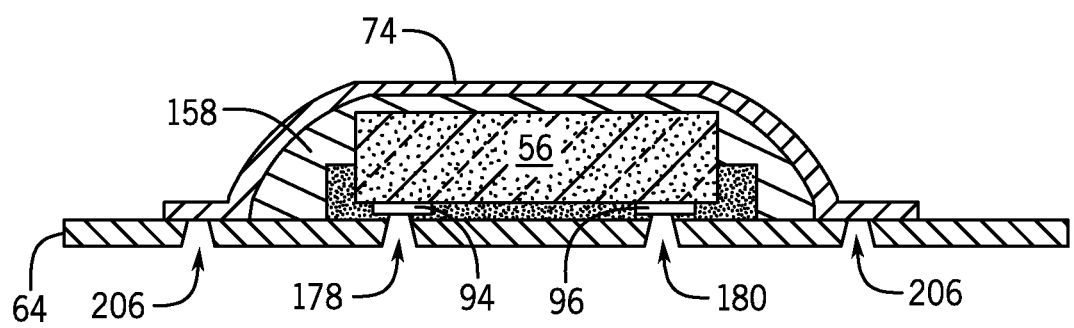

Referring next to FIG. 35, vias 178, 180 are formed through insulating substrate 64 at locations of the contact pads 94, 96 of semiconductor device 56. One or more additional vias 206 are formed at selective areas of first wiring layer 72. Vias 178, 180, 206 may be formed by known standard microvia processes, including laser ablation, plasma etch, chemical etch, and the like.

Figure 36:
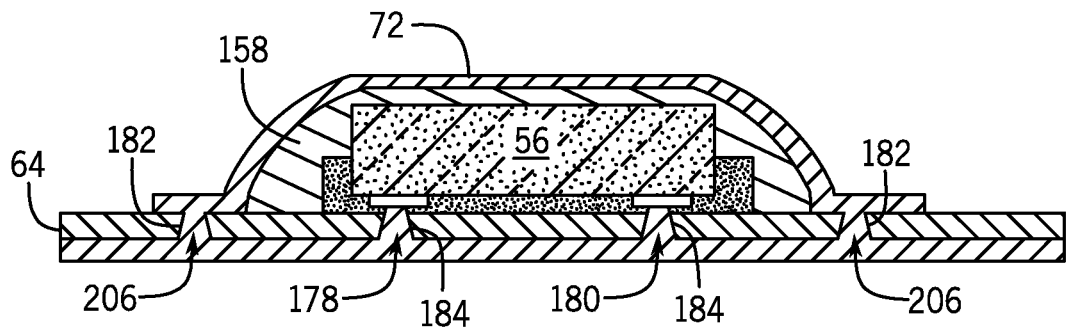
Figure 37:
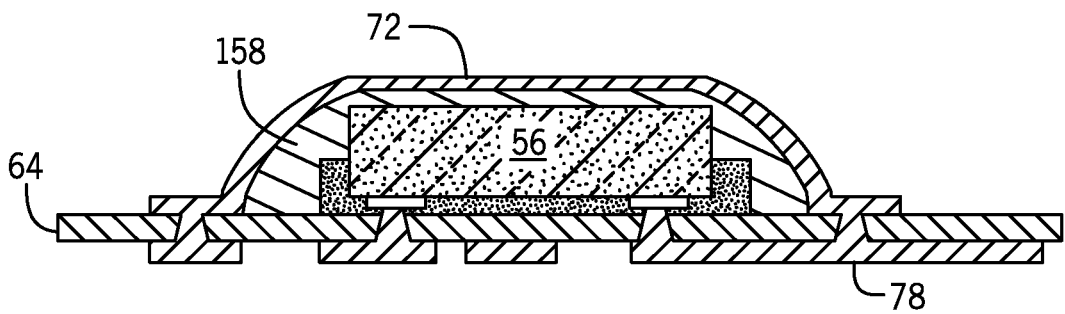
Figure 38:
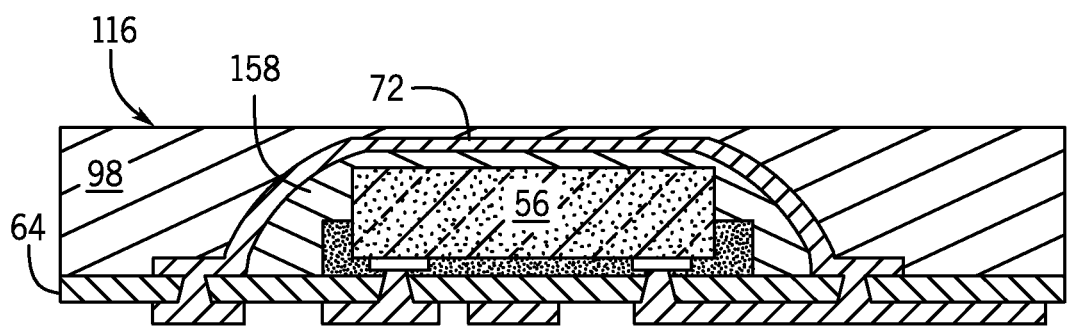
Figure 45:
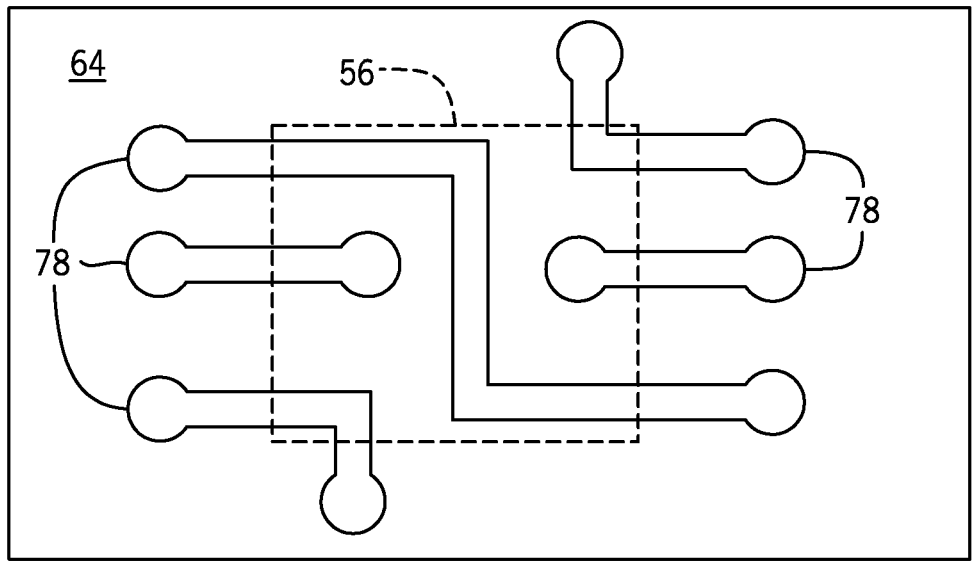
FIG. 45 is a schematic bottom view of the electronics package of FIG. 24, according to an embodiment of the invention.

Second conductive material layer 154 (FIG. 36) is then deposited onto the second surface 80 of insulating substrate 64 in a similar manner as described above with respect to first conductive layer 152. Second conductive material layer 154 extends into vias 178, 180, 206, thereby forming penetrating contacts 182, 184 coupled to first wiring layer 72 and contact pads 94, 96 of semiconductor device 56. Second conductive material layer 154 is patterned using any of the techniques described herein to form second wiring layer 78, as illustrated in FIG. 37. A bottom side view of the partially manufactured electronics package 188 is illustrated in FIG. 45 to show one exemplary and non-limiting configuration of second wiring layer 78. One skilled in the art will recognize that the second wiring layer 78 may be similarly configured having a number of different traces in any of the other embodiments of the electronics packages disclosed herein. In a next step of the manufacturing process, illustrated in FIG. 38, insulating material 98 is applied over the semiconductor device 56 and the insulating structure 158, forming a body of the electronics package 188. According to alternative and non-limiting embodiments, insulating material 98 may be applied using a pour molding, injection molding, or compression molding process.

Figure 39:
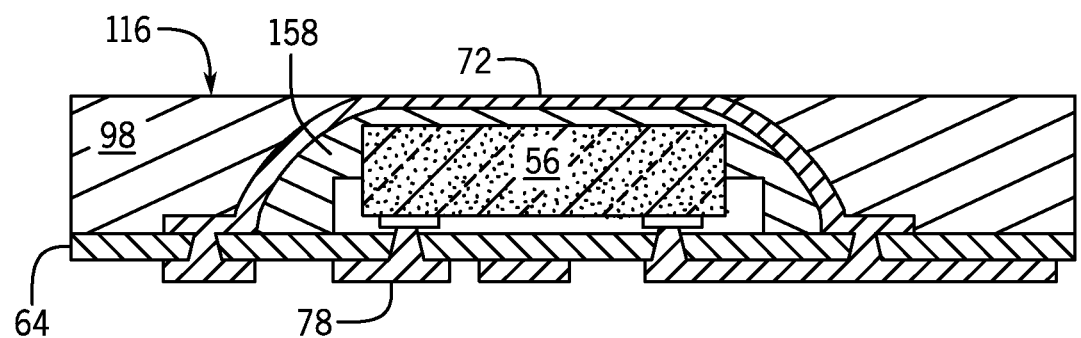

At this stage in the manufacturing process, microvias can be formed through insulating material 98 and a third layer of conductive material deposited on the insulating material 98 and thereafter patterned to form an electronics package similar to that shown in FIG. 22. Alternatively, the technique for manufacturing electronics package 188 continues by back grinding the top surface 116 of insulating material 98 to planarize the top surface 116 and to expose portions of first wiring layer 72, as shown in FIG. 39.

In an alternative embodiment, insulating material 98 may be applied prior to formation of second wiring layer 78, either before or after forming vias 178, 180, 206. Insulating material 98 may be back-ground to expose first wiring layer 72 at that stage in the manufacturing process or after forming second wiring layer 78.

Figure 40:
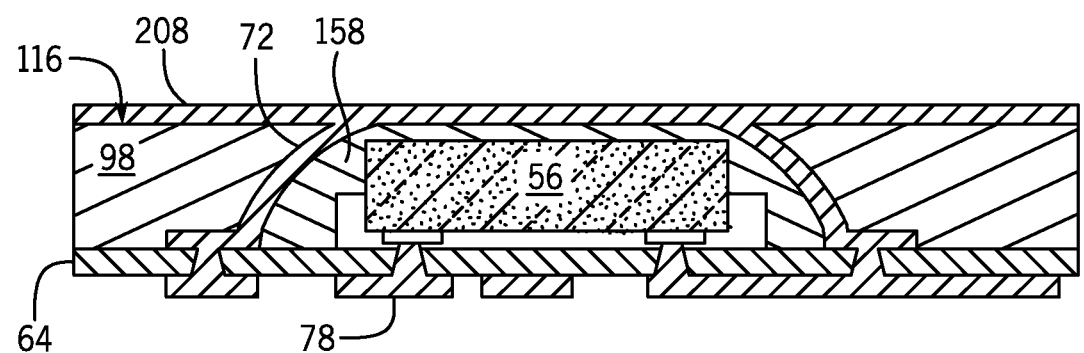
Figure 41:
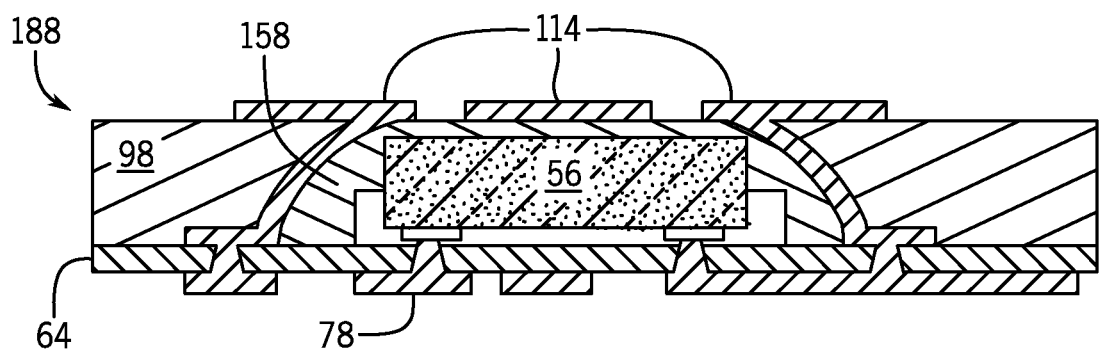
Figure 46:
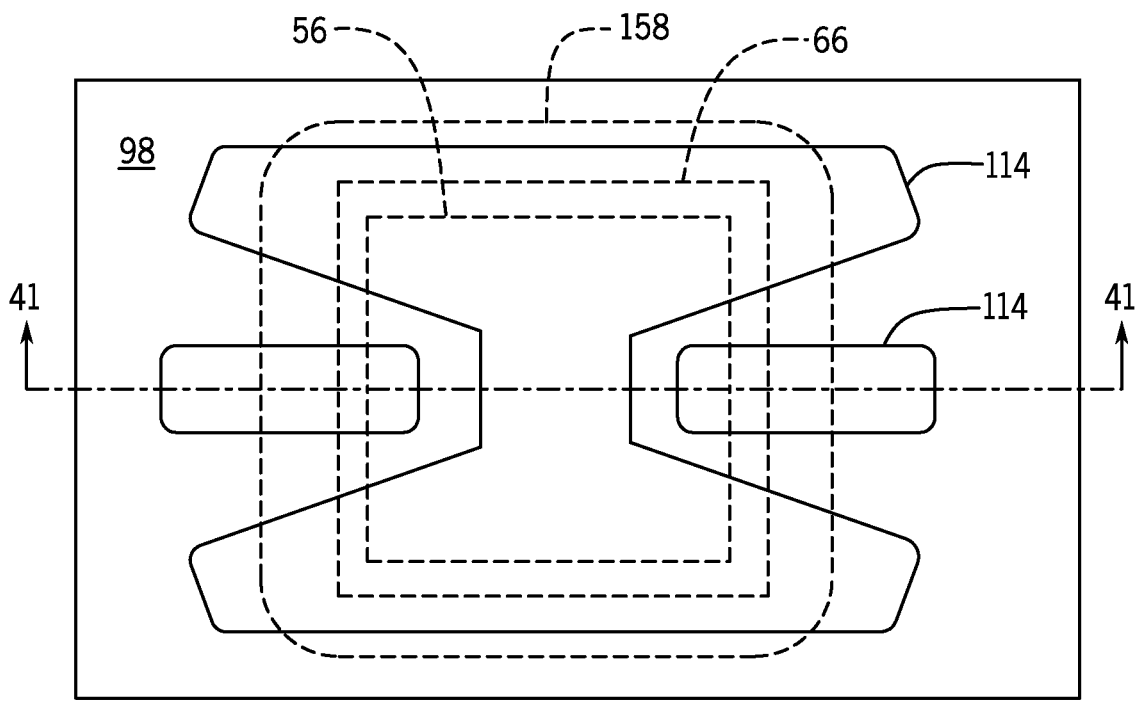
FIG. 46 is a schematic topside view of the electronics package of FIG. 24, according to an embodiment of the invention.

A layer of conductive material 208 is then applied to the top surface 116 of insulating material 98 and to exposed portions of the first wiring layer 72, as shown in FIG. 40. A patterning technique is then used to form third wiring layer 114, an exemplary embodiment of which is shown in cross-section in FIG. 41 and in more detail in the top view provided in FIG. 46. Conductive material 208 may be applied and patterned using any of the deposition and patterning techniques described above in reference to first conductive layer 152.

The order and sequence the process or method steps associated with the above-described manufacturing or build-up technique for electronics packages may be modified from that described herein while still arriving at an equivalent or substantially equivalent end structure. As one non-limiting example, in embodiments that include second insulating substrate 174, insulating material 98 may be applied using an underfill technique after the insulating substrate 174 is incorporated within the electronics package. Additionally, some or all of vias in insulating substrate 64 may be formed before semiconductor device 56 is coupled to insulating substrate 64 and the formation and patterning of the first and second wiring layers may occur simultaneously or in the opposite order previously described herein.

Figure 47:
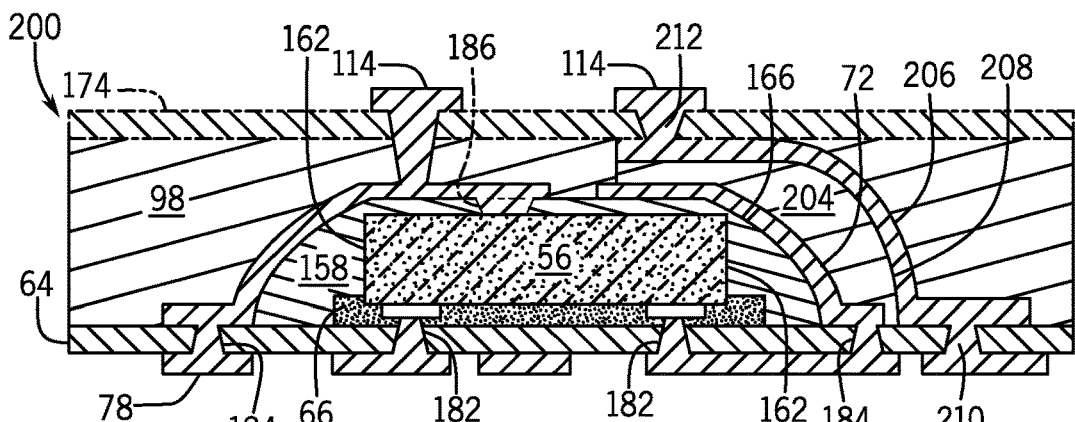
FIG. 47 is a schematic cross-sectional view of an electronics package that includes a double-sloped insulating structure, according to another embodiment of the invention.
Figure 48:
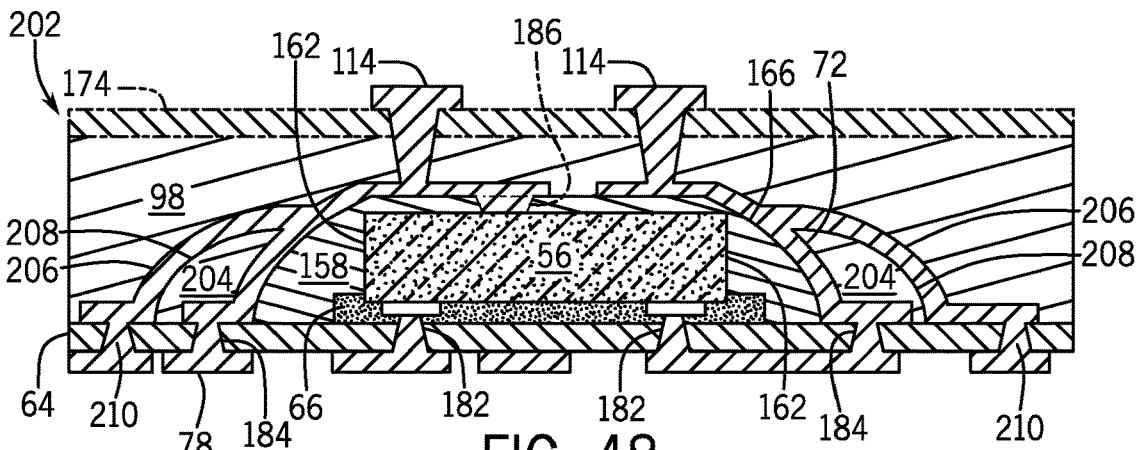
FIG. 48 is a schematic cross-sectional view of an electronics package that includes a double-sloped insulating structure, according to another embodiment of the invention.

Two alternative embodiments of an electronics package 200, 202 are illustrated in FIGS. 47 and 48. Electronics packages 200 and 202 each include a number of common structures as electronics package 156 (FIG. 22), which are referred to with common part numbers as appropriate. In the illustrated embodiments, wiring layer 72 is formed in a similar manner as described with respect to FIG. 22 and may include electrical traces arranged in a similar manner as that shown in FIG. 23 or in any number of alternative configurations based on the particular arrangement of contact pads on the active surface of semiconductor device 56.

In addition to structures common to electronics packages 200, 202, and 156, electronics packages 200, 202 each include a second insulating structure 204 that is formed atop or directly adjacent at least a portion of the insulating structure 158. The second insulating structure 204 may be formed using any of the same materials and techniques described herein with respect to insulating structure 158. Second insulating structure 204 may be formed at one or more discrete locations atop insulating structure 158, as shown in FIG. 47, or may completely surround insulating structure 158, as shown in FIG. 48.

A wiring layer 206 is formed on the sloped surface 208 of second insulating structure 204 using any of the same materials and techniques as described with respect to wiring layer 74. Wiring layer 206 is electrically coupled to wiring layer 92 by one or more penetrating contacts 210 that extend through insulating substrate 64. In some embodiments, such as illustrated in FIG. 47, another penetrating contact 212 may extend through second insulating substrate 112 to similarly electrically couple wiring layer 206 to third wiring layer 114. In electronics package 200, the second insulating structure 204 is formed having a height larger than that of insulating structure 158 to facilitate a connection between wiring layers 72 and 214. In electronics package 202, second insulating structure 204 is formed having a height less than that of insulating structure 158, with wiring layer 206 forming an electrical connection between wiring layers 72 and 78.

Figure 49:
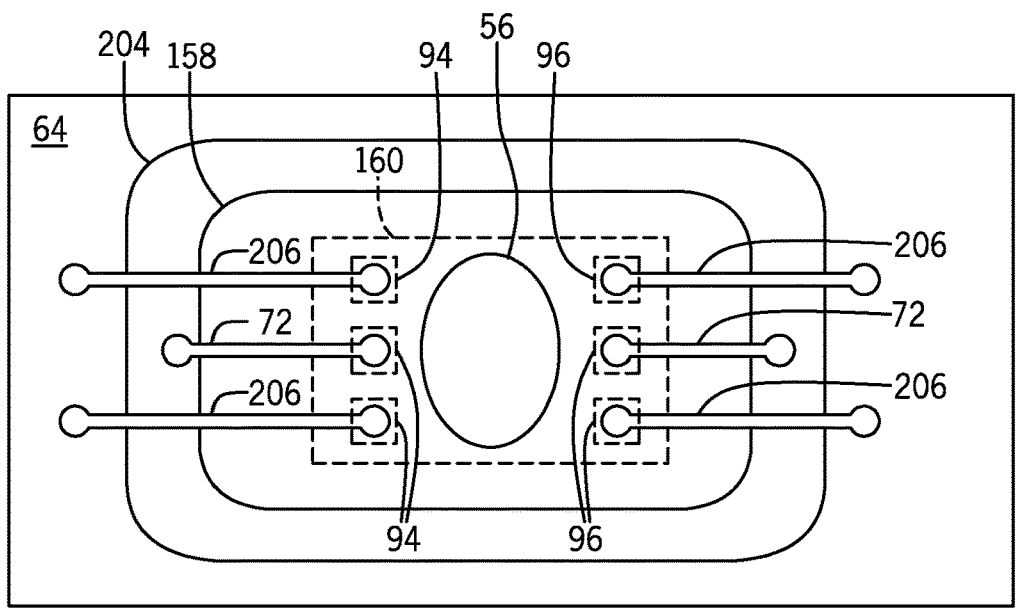
FIG. 49 is a topside view of an electronics package that includes a double-sloped insulating structure, according to another embodiment of the invention.

An exemplary configuration of wiring layers 72 and 206 is illustrated in FIG. 49. One skilled in the art will recognize that wiring layers 72 and 206 may be formed in numerous alternative configurations based on the contact pad configuration of semiconductor device 56 and the desired location of I/Os within the final electronics package. The geometry of insulating structures 158, 204 may likewise be varied from that illustrated in FIGS. 47 and 48 based on design specifications. As such, the geometry of insulating structures 158, 204 and the arrangement of wiring layers 72 and 206 is not limited to that illustrated in FIGS. 47-49. The "double-sloped" surface configuration resulting from the combination of insulating substrates 158, 204 and their associated wiring layers 72, 206 may be incorporated into any of the other electronic package embodiments described herein. Additionally, it is contemplated that the double-sloped surface configuration may be extended to include three or more layers of insulating substrate/wiring layer stackups.

In each of the electronics packages described above, the first wiring layer 72 is formed to extend along at least one sloped side wall 70, 166 of the insulating structure 68, 110, 126, 128. This first wiring layer 72 forms electrical connections between the contact pads 94, 96 of a semiconductor device 56 and the opposing surface of the electronics package in a manner that involves fewer and less complex processing steps than conventional embedded semiconductor manufacturing techniques. By using the sloped side wall 70, 166, a higher level of routing density can be achieved than with the conventional through hole structures because the resulting electrical traces of first wiring layer 72 take up less area than the conventional through hole structures. As a result, the overall size of the electronics package can be reduced as compared to that of prior art embedded device technology. First wiring layer 72 also yields connections with lower inductance and parasitic or interconnect resistance than prior art packaging techniques. The size of the individual traces and terminal pads of first wiring layer 72 and the corresponding penetrating contacts that couple first wiring layer 72 to the second wiring layer 78 can easily be varied within the electronics package. Utilizing an insulating structure 68, 110, 126, 128 also provides improved thermal dissipation within the resulting electronics package.

Beneficially, embodiments of the invention thus provide for higher power handling and performance and smaller form factor compared to a prior art wire bonding package and higher thermal performance and lower costs compared to a prior art flip chip package. Embodiments of the invention disclosed herein also provide a lower cost, faster turn time process than existing prior art embedded power packages. Accordingly, the embodiments described herein provide a low cost solution with higher performance as compared to prior art approaches.

Therefore, according to one embodiment of the invention, an electronics package includes an insulating substrate, an electrical component having an active surface coupled to a first surface of the insulating substrate, and an insulating structure disposed adjacent the electrical component on the first surface of the insulating substrate. A first wiring layer is formed on a top surface of the insulating structure and extends down at least one sloped side surface of the insulating structure. A second wiring layer is formed on a second surface of the insulating substrate. The second wiring layer extends through a plurality of vias in the insulating substrate to electrically couple at least one contact pad on the active surface of the electrical component to the first wiring layer.

According to another embodiment of the invention, a method of manufacturing an electrical component includes coupling an electrical component to a first surface of an insulating substrate, disposing an insulating structure on the first surface of the insulating substrate, and forming a first wiring layer on a top surface and at least one sloped side surface of the insulating structure. The method also includes forming a second wiring layer on a second surface of the insulating substrate, the second wiring layer electrically coupling at least one contact pad of the electrical component to the first wiring layer through a plurality of vias in the insulating substrate.

According to yet another embodiment of the invention, an electrical package includes an electrical component coupled to a first surface of an insulating substrate and an insulating structure encapsulating at least a portion of a back surface and at least one side wall defining a perimeter of the electrical component. The insulating structure has at least one sloped side surface abutting the perimeter of the electrical component. A first wiring layer is formed on the at least one sloped side surface of the insulating substrate and extends over a top surface of the electrical component. A second wiring layer is formed on a second surface of the insulating substrate and extends through vias formed therein to electrically couple at least one contact pad on an active surface of the electrical component to the first wiring layer.

While the invention has been described in detail in connection with only a limited number of embodiments, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. Additionally, while various embodiments of the invention have been described, it is to be understood that aspects of the invention may include only some of the described embodiments. Accordingly, the invention is not to be seen as limited by the foregoing description, but is only limited by the scope of the appended claims.

What is claimed is:

1. An electronics package comprising:
   an insulating substrate;
   an electrical component having an active surface coupled to a first surface of the insulating substrate;
   an insulating structure disposed adjacent the electrical component on the first surface of the insulating substrate;
   a first wiring layer formed on a top surface of the insulating structure and extending down at least one sloped side surface of the insulating structure; and
   a second wiring layer formed on a second surface of the insulating substrate, the second wiring layer extending through a plurality of vias in the insulating substrate to electrically couple at least one contact pad on the active surface of the electrical component to the first wiring layer.

2. The electronics package of claim 1 wherein the first wiring layer comprises:
   a first electrical trace electrically coupled to a first contact pad on the active surface of the electrical component; and
   a second electrical trace electrically coupled to a second contact pad on the active surface of the electrical component.

3. The electronics package of claim 2 wherein the first electrical trace extends down a first sloped side surface of the insulating structure; and
   wherein the second electrical trace is positioned adjacent the first electrical trace on the first sloped side surface of the insulating structure.

4. The electronics package of claim 1 further comprising an insulating material surrounding the electrical component and the at least one sloped side surface of the insulating structure; and
   wherein a top surface of the first wiring layer is exposed through the insulating material.

5. The electronics package of claim 1 further comprising:
   an insulating material surrounding the insulating structure and the electrical component; and
   a third wiring layer formed on a top surface of the insulating material and extending through a via therein to electrically couple with the first wiring layer.

6. The electronics package of claim 1 wherein the insulating structure is substantially trapezoidal.

7. The electronics package of claim 1 wherein the electrical component comprises a semiconductor device, and wherein the active surface of the semiconductor device faces the first surface of the insulating substrate and is coupled thereto.

8. A method of manufacturing an electronics package comprising:
   coupling an electrical component to a first surface of an insulating substrate;
   disposing an insulating structure on the first surface of the insulating substrate;
   forming a first wiring layer on a top surface and at least one sloped side surface of the insulating structure; and
   forming a second wiring layer on a second surface of the insulating substrate, the second wiring layer electrically coupling at least one contact pad of the electrical component to the first wiring layer through a plurality of vias in the insulating substrate.

9. The method of claim 8 further comprising patterning the first wiring layer to define a plurality of electrical traces.

10. The method of claim 8 further comprising positioning the insulating structure adjacent to and spaced apart from the electrical component on first surface of the insulating substrate.

11. The method of claim 8 further comprising disposing the insulating structure to surround or substantially surround a perimeter of the electrical component.

12. The method of claim 8 further comprising:
    applying a photo-patternable material to the first surface of the insulating substrate;
    disposing a mask atop the photo-patternable material; and
    directing light onto the mask to selectively cure at least one region of the photo-patternable material and form the insulating structure.

13. The method of claim 8 wherein disposing the insulating structure on the first surface of the insulating substrate comprises direct deposition of insulating material in sequential steps.

14. The method of claim 8 wherein disposing the insulating structure on the first surface of the insulating substrate comprises adhesively coupling a pre-fabricated insulating structure to the insulating substrate.

15. An electrical package comprising:
    an electrical component coupled to a first surface of an insulating substrate;
    an insulating structure encapsulating at least a portion of a back surface and at least one side wall defining a perimeter of the electrical component, the insulating structure having at least one sloped side surface abutting the perimeter of the electrical component;
    a first wiring layer formed on the at least one sloped side surface of the insulating structure and extending over a top surface of the electrical component; and
    a second wiring layer formed on a second surface of the insulating substrate and extending through vias formed therein to electrically couple at least one contact pad on an active surface of the electrical component to the first wiring layer.

16. The electrical package of claim 15 wherein the first wiring layer comprises a plurality of electrical traces, each having a first terminal pad positioned above the back surface of the electrical component and a second terminal pad positioned on the first surface of the insulating substrate.

17. The electrical package of claim 15 further comprising an insulating material surrounding the insulating structure and the first wiring layer.

18. The electrical package of claim 17 further comprising a support structure embedded within the insulating material, the support structure having an opening formed therein surrounding the insulating structure.

19. The electrical package of claim 17 further comprising a third wiring layer formed on a top surface of the insulating material and electrically coupled to the first wiring layer through at least one via formed in the insulating material.

20. The electrical package of claim 15 wherein the first wiring layer comprises a first electrical trace that electrically couples with the back surface of the electrical component through a metalized via in the insulating structure.

21. The electrical package of claim 15 further comprising a passive component coupled to the first surface of the insulating structure; and
   wherein the second wiring layer extends through vias in the insulating substrate to electrically couple at least one contact pad of the passive component.

22. The electrical package of claim 21 wherein the electrical component and the passive component are fully encapsulated within the insulating structure.

23. The electrical package of claim 15 wherein the electrical component is fully encapsulated within the insulating structure.

24. The electronics package of claim 1 wherein the insulating structure is disposed only on the first surface of the insulating substrate.

\* \* \* \* \*